United States Patent
Shim et al.

(10) Patent No.: US 10,103,129 B2
(45) Date of Patent: *Oct. 16, 2018

(54) DATA STORAGE DEVICE HAVING MULTI-STACK CHIP PACKAGE AND OPERATING METHOD THEREOF

(71) Applicant: Samsung Electronics Co., Ltd., Suwon-si (KR)

(72) Inventors: Young-seop Shim, Seoul (KR); Jaehong Kim, Seoul (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/840,314

(22) Filed: Dec. 13, 2017

(65) Prior Publication Data

US 2018/0102347 A1 Apr. 12, 2018

Related U.S. Application Data

(63) Continuation of application No. 15/443,963, filed on Feb. 27, 2017, now Pat. No. 9,871,021.

(30) Foreign Application Priority Data

May 10, 2016 (KR) .......................... 10-2016-0057168

(51) Int. Cl.
*G11C 11/34* (2006.01)
*H01L 25/065* (2006.01)
(Continued)

(52) U.S. Cl.
CPC ............ *H01L 25/0657* (2013.01); *G11C 5/04* (2013.01); *G11C 16/0466* (2013.01); *G11C 16/0483* (2013.01); *G11C 16/10* (2013.01); *G11C 16/30* (2013.01); *G11C 29/021* (2013.01); *H01L 23/49838* (2013.01); *H01L 23/528* (2013.01); *H01L 24/48* (2013.01); *H01L 2224/48091* (2013.01); *H01L 2224/48106* (2013.01); *H01L 2224/48147* (2013.01); *H01L 2224/48227* (2013.01); *H01L 2225/0651* (2013.01); *H01L 2225/06506* (2013.01);
(Continued)

(58) Field of Classification Search
CPC . G11C 16/0466; G11C 16/0483; G11C 16/08; G11C 16/10; G11C 16/30
See application file for complete search history.

(56) References Cited

U.S. PATENT DOCUMENTS 7,368,223 B2 5/2008 Meinders et al.
7,679,133 B2 3/2010 Son et al.
(Continued)

FOREIGN PATENT DOCUMENTS

JP 2014-049160 A 3/2014

*Primary Examiner* — Pho M Luu
(74) *Attorney, Agent, or Firm* — Muir Patent Law, PLLC

(57) ABSTRACT

A data storage device includes a controller and a multi-stack chip package. A method is used to operate the data storage device. The multi-stack chip package includes a first semiconductor chip arranged on a package substrate, a second semiconductor chip arranged on the first semiconductor chip, and a third semiconductor chip is arranged between the first and second semiconductor chips. The controller can control the first to third semiconductor chips by using a feature parameter measured from each semiconductor chip and a target value that may be originally designed by a memory vendor.

5 Claims, 21 Drawing Sheets

(51) Int. Cl.
  H01L 23/498 (2006.01)
  G11C 16/30 (2006.01)
  G11C 16/10 (2006.01)
  H01L 23/528 (2006.01)
  G11C 16/04 (2006.01)
  G11C 5/04 (2006.01)
  G11C 29/02 (2006.01)
  H01L 23/00 (2006.01)

(52) U.S. Cl.
  CPC ........... *H01L 2225/06562* (2013.01); *H01L 2225/06586* (2013.01); *H01L 2924/1438* (2013.01); *H01L 2924/15311* (2013.01)

(56) References Cited

U.S. PATENT DOCUMENTS

| | | | |
|---|---|---|---|
| 7,868,443 B2 | 1/2011 | Kwon et al. | |
| 8,125,103 B2 | 2/2012 | Ito | |
| 8,130,573 B2 | 3/2012 | Choi | |
| 8,228,704 B2* | 7/2012 | Choo | G11C 5/02 257/676 |
| 8,437,160 B2 | 5/2013 | Hwang et al. | |
| 8,467,244 B2* | 6/2013 | Jeon | G11C 16/349 365/145 |
| 8,553,466 B2 | 10/2013 | Han et al. | |
| 8,559,235 B2 | 10/2013 | Yoon et al. | |
| 8,588,017 B2 | 11/2013 | Park et al. | |
| 8,601,332 B2 | 12/2013 | Jeddeloh | |
| 8,654,587 B2 | 2/2014 | Yoon et al. | |
| 8,947,931 B1 | 2/2015 | D'Abreu | |
| 9,202,796 B2 | 12/2015 | Park | |
| 9,294,983 B2* | 3/2016 | Kidron | H04W 40/02 |
| 9,356,234 B2* | 5/2016 | Ko | H01L 45/1253 |
| 9,871,021 B2* | 1/2018 | Shim | H01L 25/0657 |
| 2011/0233648 A1 | 9/2011 | Seol et al. | |
| 2012/0249218 A1 | 10/2012 | Shoemaker | |
| 2014/0040698 A1 | 2/2014 | Loh et al. | |
| 2014/0131867 A1 | 5/2014 | Jeong et al. | |

* cited by examiner

DATA STORAGE DEVICE HAVING MULTI-STACK CHIP PACKAGE AND OPERATING METHOD THEREOF

CROSS-REFERENCE TO RELATED APPLICATIONS

This application is a continuation application of U.S. patent application Ser. No. 15/443,963, filed on Feb. 27, 2017, now U.S. Pat. No. 9,871,021, issued Jan. 16, 2018, which claims priority under 35 U.S.C. § 119 to Korean Patent Application No. 10-2016-0057168 filed May 10, 2016, in the Korean Intellectual Property Office, the entire contents of each of which are hereby incorporated by reference.

BACKGROUND

Embodiments of the inventive concept described herein relate to a data storage device including a multi-stack chip package with improved reliability.

A mass storage device such as a solid state drive (SSD) includes multi-stack chip packages, in which a plurality of semiconductor devices are stacked, to store data. In general, each multi-stack chip package may be connected to a controller through one common channel. A considerable quantity of thermal stress and mechanical stress may be applied to a semiconductor package in the process of manufacturing a multi-stack chip package by stacking semiconductor chips on a package board. Intrinsic parameters of a package, such as an internal voltage, a program voltage, and an erase voltage of a semiconductor chip, may be changed due to the stress regardless of the intent of a memory vendor. The change of the parameters may cause a serious error with respect to an operation of a data storage device. For example, a program error may occur due to generation of a program voltage that the memory vendor does not design. The program error may unfortunately need an additional program operation or cause an increase in an execution frequency of a dense code during a read operation. Accordingly, there is a need to solve issues due to a parameter change upon manufacturing of a semiconductor package in terms of product reliability and life cycle.

SUMMARY

Embodiments of the inventive concept provide a method of improving reliability of a data storage device including a multi-stack chip package.

According to certain example implementations, a data storage device includes a multi-stack chip package comprising a first semiconductor chip, a second semiconductor chip, and a third semiconductor chip, wherein the first semiconductor chip is arranged on a package substrate and has a first measured feature parameter value for a first particular feature parameter, the second semiconductor chip is arranged on the first semiconductor chip and has a second measured feature parameter value for the first particular feature parameter, and the third semiconductor chip is arranged between the first and second semiconductor chips and has a third measured feature parameter value for the first particular feature parameter. The storage device also includes a controller configured to control the first to third semiconductor chips by using the first measured feature parameter value and a target value, for the first semiconductor chip, using the second measured feature parameter value and the target value, for the second semiconductor chip, and using the third measured feature parameter value and the target value, for the third semiconductor chip. A difference between the first measured feature parameter value and the target value ("first feature difference") is greater than a difference between the third measured feature parameter value and the target value ("third feature difference"), and a difference between the second feature parameter value and the target value ("second feature difference") is greater than the third feature difference.

According to one example implementation, a method is disclosed for controlling a data storage device which comprises a multi-stack chip package comprising a first semiconductor chip, a second semiconductor chip, and a third semiconductor chip, wherein the first semiconductor chip is arranged on a package substrate and has a first feature parameter, the second semiconductor chip is arranged on the first semiconductor chip and has a second feature parameter, and the third semiconductor chip is arranged between the first and second semiconductor chips and has a third feature parameter. The method includes measuring values of the first, second, and third feature parameters from the first, second, and third semiconductor chips, respectively; storing the values of the first to third feature parameters in the first to third semiconductor chips, respectively; reading the values of the first to third stored feature parameter values when the data storage device is booted on; and controlling the first to third semiconductor chips by using a difference (hereinafter referred to as a "first feature difference") between the first feature parameter value and a target value, a difference (hereinafter referred to as a "second feature difference") between the second feature parameter value and the target value, and a difference (hereinafter referred to as a "third feature difference") between the third feature parameter value and the target value, wherein the first feature difference is greater than the third feature difference and the second feature difference is greater than the third feature difference.

According to one example implementation, a multi-stack chip package includes a first semiconductor chip arranged on a package substrate and having a first measured feature parameter value for a particular feature parameter; a second semiconductor chip arranged on the first semiconductor chip and having a second measured feature parameter value for the first particular feature parameter; and a third semiconductor chip arranged between the first and second semiconductor chips and having a third measured feature parameter value for the first particular feature parameter. The first to third semiconductor chips include a difference (hereinafter referred to as a "first feature difference") between the first feature parameter and a target value, a difference (hereinafter referred to as a "second feature difference") between the second feature parameter and the target value, and a difference (hereinafter referred to as a "third feature difference") between the third feature parameter and the target value. The first feature difference is greater than the third feature difference and the second feature difference is greater than the third feature difference, and the first semiconductor chip is configured to be controlled based on the first measured feature parameter value and the target value, the second semiconductor chip is configured to be controlled based on the second measured feature parameter value and the target value, and the third semiconductor chip is configured to be controlled based on the third measured feature parameter value and the target value.

According to one example implementation, a data storage method in a multi-stack chip package is disclosed. The multi-stack chip package includes a first semiconductor chip, a second semiconductor chip, and a third semiconductor chip. The first semiconductor chip is arranged on a package substrate and has a first measured feature parameter value for a first particular feature parameter, the second semiconductor chip is arranged on the first semiconductor chip and has a second measured feature parameter value for the first particular feature parameter, and the third semiconductor chip is arranged between the first and second semiconductor chips and has a third measured feature parameter value for the first particular feature parameter. The method includes controlling the first semiconductor chip by using the first measured feature parameter value and a target value, controlling the second semiconductor chip using the second measured feature parameter value and the target value, and controlling the third semiconductor chip using the third measured feature parameter value and the target value, wherein a difference between the first measured feature parameter value and the target value ("first feature difference") is greater than a difference between the third measured feature parameter value and the target value ("third feature difference"), and a difference between the second feature parameter value and the target value ("second feature difference") is greater than the third feature difference.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
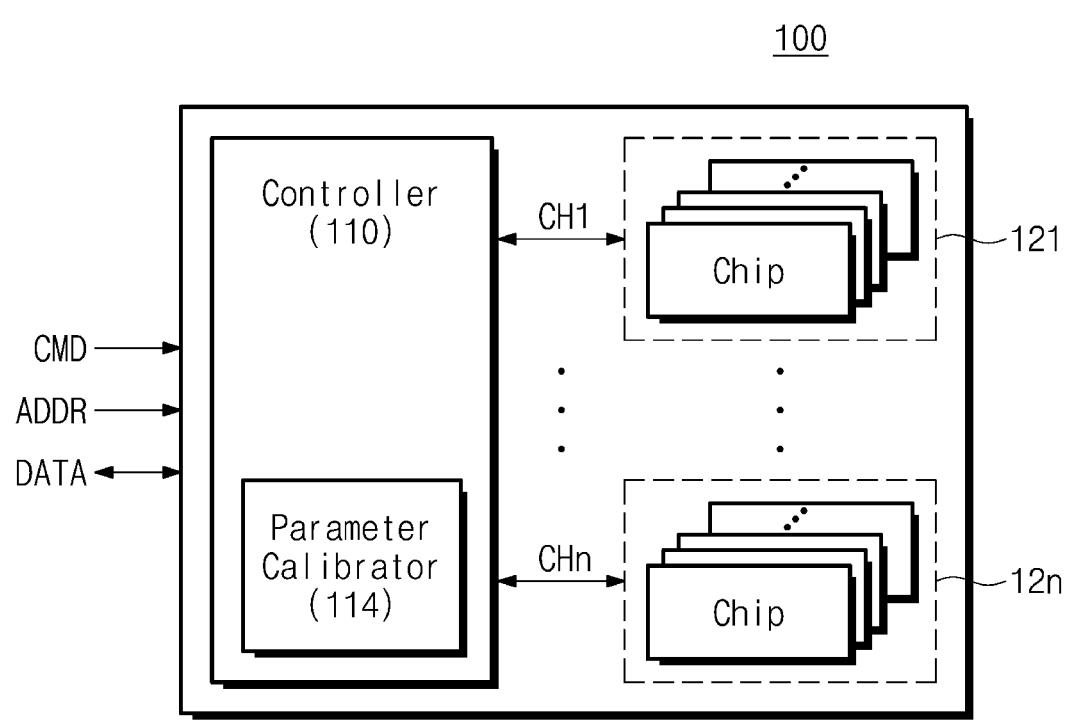
FIG. 1 is a block diagram illustrating a data storage device according to embodiments of the inventive concept.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, and may be referred to using language such as "in one embodiment," these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

FIG. 1 is a block diagram illustrating a data storage device 100 according to an embodiment of the inventive concept. Referring to FIG. 1, the data storage device 100 may include a controller 110 and a plurality of semiconductor packages 121 to 12n. Each of the semiconductor packages 121 to 12n may include a plurality of semiconductor chips, for example stacked on a package substrate. Each of the semiconductor packages 121 to 12n may be connected to the controller 110 through one channel. For example, a first semiconductor package 121 may be connected to the controller 110 through a first channel CH1, and an n-th semiconductor package 12n may be connected to the controller 110 through an n-th channel CHn.

The controller 110 may control an overall operation of the data storage device 100. For example, the controller 110 may store data "DATA" in the semiconductor packages 121 to 12n or read data "DATA" therefrom, based on a command CMD and address ADDR received from a host (not illustrated).

The controller 110 may include a parameter calibrator 114. A feature parameter may be defined with a physical value that is associated with an operation of a semiconductor chip practically measured from the semiconductor chip. The parameter calibrator 114 may control each semiconductor chip such that a feature parameter of each of semiconductor chips constituting a semiconductor package is the same as a target value originally designed by a memory vendor. For example, the feature parameter may include various voltages needed to perform read, write, and erase operations with respect to a semiconductor chip. The feature parameter may include a voltage needed to drive various logic circuits (or peripheral circuits). Furthermore, the feature parameter may include a toggling frequency for each reference period, which is associated with a data strobe signal to be sent to each semiconductor chip. The feature parameter will be more fully described below with reference to accompanying drawings.

For example, the case where the feature parameter is a program voltage will be briefly described. A specific program voltage value (i.e., a target value), which the memory vendor designs, may be stored in a specific space (e.g., E-FUSE, etc) of the semiconductor chip for use in a program operation. However, a physical characteristic of a semiconductor chip may be changed due to various mechanical stresses or thermal stresses that occur in the process of stacking semiconductor chips one upon another. That is, a value of a program voltage, which is practically generated in a semiconductor chip, may be different from a value (i.e., a target value) of a program voltage that the memory vendor designs. If a program voltage designed by the memory vendor is not generated normally, a program fail may occur, or it may be difficult to program memory cells to desired target program states. Accordingly, an operation of addressing the above-described issue may be additionally performed.

After a packing process is performed, a program voltage practically generated in each semiconductor chip is measured in a semiconductor package test step, and the measured program voltages are respectively stored in specific areas of the semiconductor chips. When a semiconductor package (one of 121 to 12n) or the data storage device 100 including the semiconductor package is used by an end user, the parameter calibrator 114 may control semiconductor chips such that a program voltage practically generated in each semiconductor chip is the same as a program voltage value (i.e., a target value) originally designed by the memory vendor. In this case, the parameter calibrator 114 may refer to a feature parameter (e.g., a program voltage practically measured in a test step) stored in a specific area of each semiconductor chip.

With the above-described configuration, since a semiconductor chip is controlled such that a feature parameter value is the same as a target value originally designed by the memory vendor, there is no need to directly control a memory cell array (not illustrated) of each semiconductor chip (e.g., execute an additional program, additional operation for error correction, etc). Accordingly, it may be possible to more fundamentally prevent issues caused when a program voltage designed by the memory vendor is not generated. A program voltage is briefly described as an example of the feature parameter, but embodiments are not limited thereto.

Figure 2:
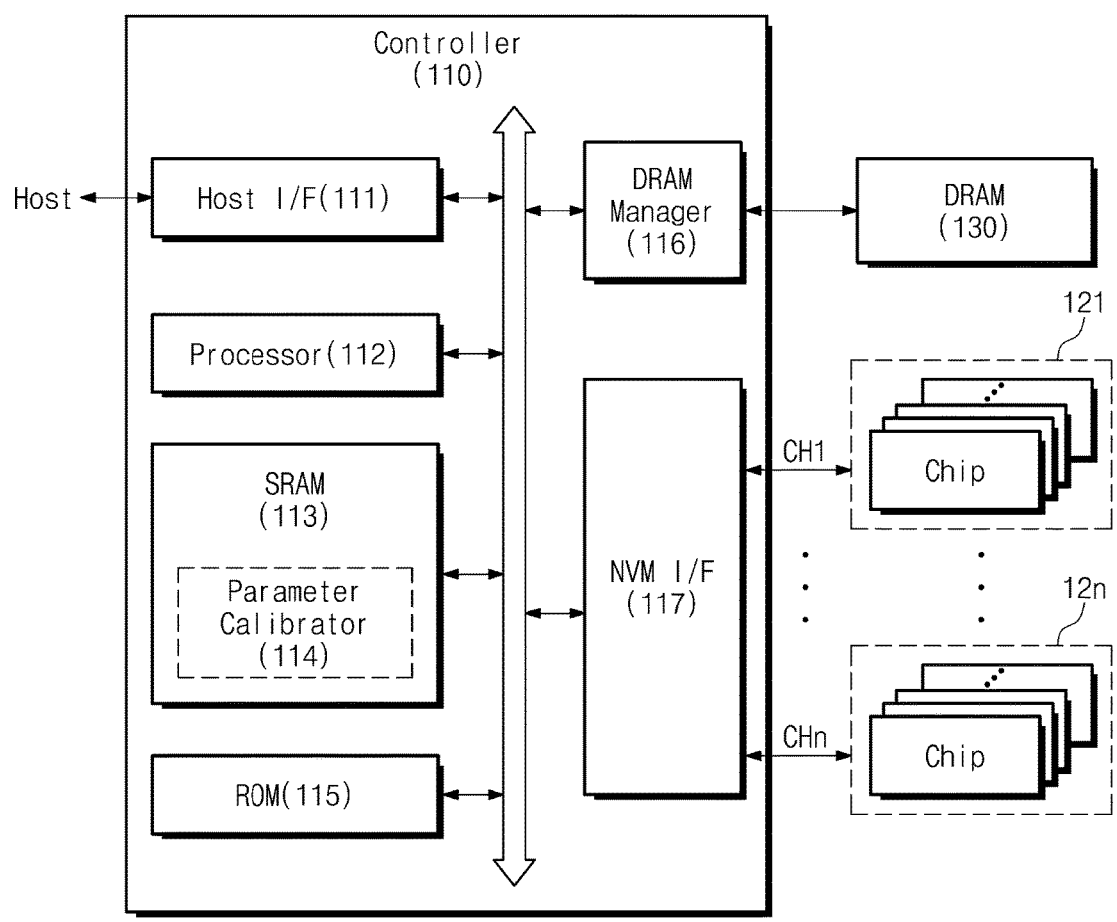
FIG. 2 is a block diagram illustrating a detailed configuration of the data storage device illustrated in FIG. 1, according to certain embodiments.

FIG. 2 is a block diagram of a detailed configuration of the data storage device 100 illustrated in FIG. 1, according to certain embodiments. For example, the data storage device 100 may be a solid state drive (SSD). Referring to FIG. 2, the data storage device 100 may include the controller 110, the plurality of semiconductor packages 121 to 12n, and a dynamic random access memory (DRAM) 130. The controller 110 may include a host interface circuit 111, a processor 112, a static random access memory (SRAM) 113, a read only memory (ROM) 115, a DRAM manager 116, and a nonvolatile memory interface circuit 117.

The host interface 111 may provide an interface between a host and the controller 110. The host and the controller 110 may be connected through at least one of various standardized interfaces. The standardized interfaces may include various interfaces such as an advanced technology attachment (ATA), a serial ATA (SATA), an external SATA (e-SATA), a small computer small interface (SCSI), a serial attached SCSI (SAS), a peripheral component interconnection (PCI), a PCI Express (PCI-E), a universal serial bus (USB), IEEE 1394, a card interface, and the like.

The processor 112 may perform an overall operation of the controller 110. The processor 112 may drive a variety of firmware needed to operate the data storage device 100. Such firmware may include the parameter calibrator 114 briefly described with reference to FIG. 1, a flash translation layer (FTL), etc.

The firmware such as the parameter calibrator 114 and the FTL may be loaded on the SRAM 113, and the firmware loaded on the SRAM 113 may be driven by the processor 112. Such firmware may include the parameter calibrator 114 briefly described with reference to FIG. 1, a flash translation layer (FTL), etc. For example, when the data storage device 100 is booted on, a value of a feature parameter read from each semiconductor chip may be stored in the SRAM 113. Even though the SRAM 113 is described as an example, a cache memory, a DRAM, a phase-change RAM (PRAM), or a flash memory, etc. may be used instead of the SRAM 113.

Various firmware needed to operate the controller 110 may be stored in the ROM 115. For example, code data for an interface with the host may be stored in the ROM 115.

The DRAM manager 116 may provide an interface between the controller 110 and the DRAM 130.

The DRAM 130 may temporarily store data to be stored in the semiconductor packages 121 to 12n and data read therefrom. Alternatively, the above-described parameter calibrator 114 and FTL may be loaded on the DRAM 130 and may be driven by the processor 111. For example, when the data storage device 100 is booted on, a value of a feature parameter read from each semiconductor chip may be stored in the DRAM 130.

The nonvolatile memory interface circuit 117 may provide an interface between the controller 110 and the semiconductor packages 121 to 12n. The semiconductor packages 121 to 12n may be connected to the nonvolatile memory interface circuit 117 through the channels CH1 to CHn, respectively. For example, the controller 110 may exchange data with each of semiconductor chips constituting the semiconductor packages 121 to 12n through the nonvolatile memory interface circuit 117.

Each of semiconductor chips constituting the semiconductor packages 121 to 12n may include, for example, a three-dimensional (3D) memory array. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the inventive concept, the 3D memory array includes vertical NAND strings that are vertically oriented such that at least one memory cell is located over another memory cell. The at least one memory cell may comprise a charge trap layer. Each vertical NAND string may include at least one select transistor located over memory cells. At least one selection transistor may have the same structure as memory cells, and be monolithically formed together with memory cells.

The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648. However, the nonvolatile memories 1220 may be, but not limited to, a planar type of memory device.

Figure 3:
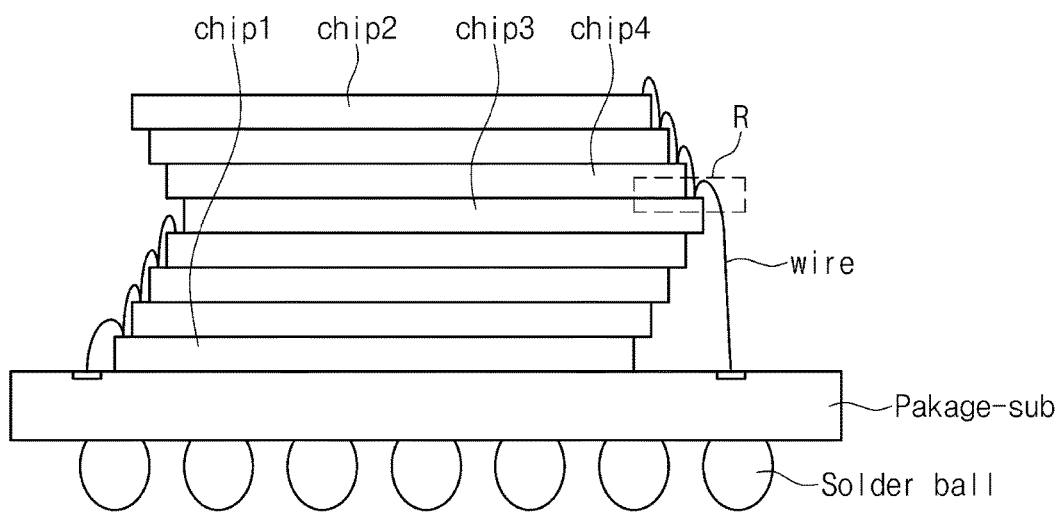
FIG. 3 is a block diagram illustrating one of semiconductor packages illustrated in FIG. 1, according to certain embodiments.

FIG. 3 is a block diagram illustrating one of the nonvolatile memories described FIG. 1, according to certain embodiments. In one embodiment, the first semiconductor package 121 is illustrated in FIG. 3. The first semiconductor package 121 may include a package substrate Package-sub and a plurality of semiconductor chips.

The semiconductor chips may be provided on the package substrate Package-sub. For example, they may be vertically stacked on the package substrate Package-sub. The embodiment illustrated in FIG. 3 shows the first semiconductor package 121 including eight semiconductor chips. However, the number of semiconductor chips is not limited thereto. As illustrated in FIG. 3, a first semiconductor chip chip1 may be a semiconductor chip that is mounted directly on the package substrate Package-sub. A second semiconductor chip chip2 may be a semiconductor chip, which is arranged in the uppermost layer, from among the semiconductor chips. A third chip chip3 may be a semiconductor chip that is arranged between the first semiconductor chip chip1 and the second semiconductor chip chip2. This explanation is equally applied to this specification, and embodiments will be described on the basis of the explanation. However, for description purposes, and claim purposes, the terms "first," "second," etc., used to describe chips or other items herein may refer to any particular ones of the chips, within the context of the description.

A plurality of semiconductor chips may be connected to a shared channel (e.g., CH1 of FIG. 1) through wires. An embodiment is exemplified in FIG. 3 as a plurality of semiconductor chips are mounted by a wire bonding manner on the package substrate Package-sub. However, a plurality of semiconductor chips may be mounted by a flip-chip manner on the package substrate Package-sub. In addition, the first semiconductor package 121 may be a multi-stack chip package that is manufactured by various manners without being limited to the above-described manners. For example, it may use through substrate vias (TSVs). Although not illustrated in FIG. 3, the first semiconductor package 121 may further include a molding film (not illustrated) covering the semiconductor chips.

Various mechanical or thermal stresses, which are generated in the process of manufacturing a semiconductor package, may be directly transferred to a plurality of semiconductor chips. This may cause a variation of a physical characteristic of each semiconductor chip. For example, in the case where the feature parameter is a program voltage, a program voltage, which has a value different from that of a program voltage (i.e., a target value) originally designed by the memory vendor, may be generated in a semiconductor chip. The feature parameter may be changed in the process of assembling a semiconductor package in the data storage device 100 (refer to FIG. 1) as well as in the process of manufacturing the semiconductor package. A shift of the feature parameter is illustrated in FIGS. 4 and 5.

Figure 4:
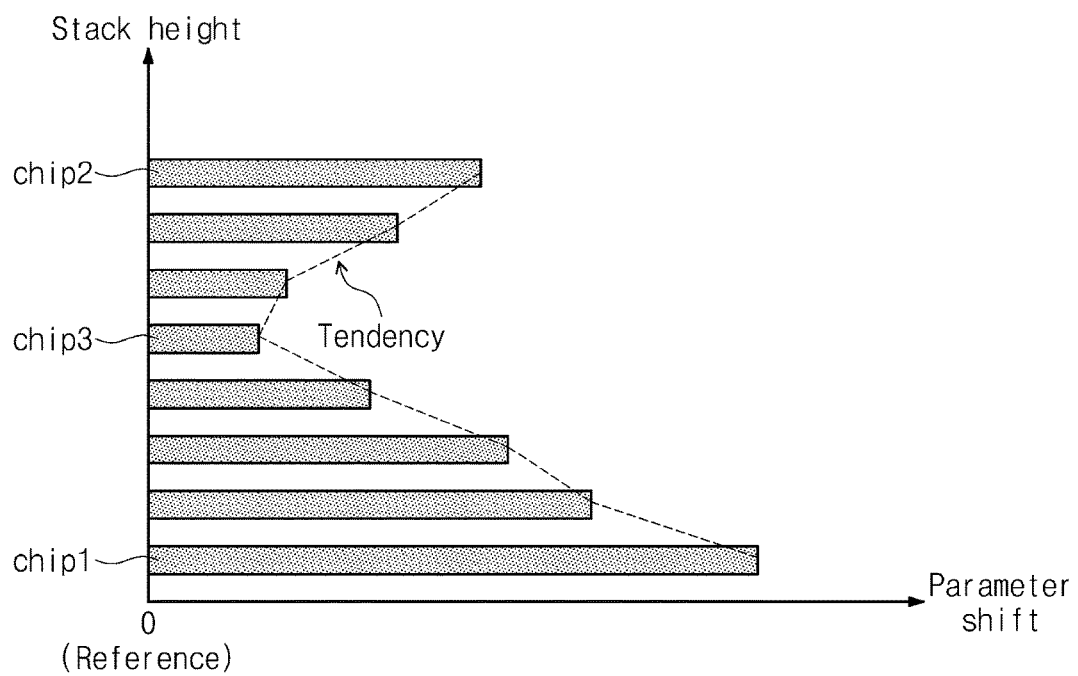
FIGS. 4 and 5 are graphs illustrating a shift of a feature parameter generated in a semiconductor package manufacturing process or a semiconductor package assembling process.
Figure 5:
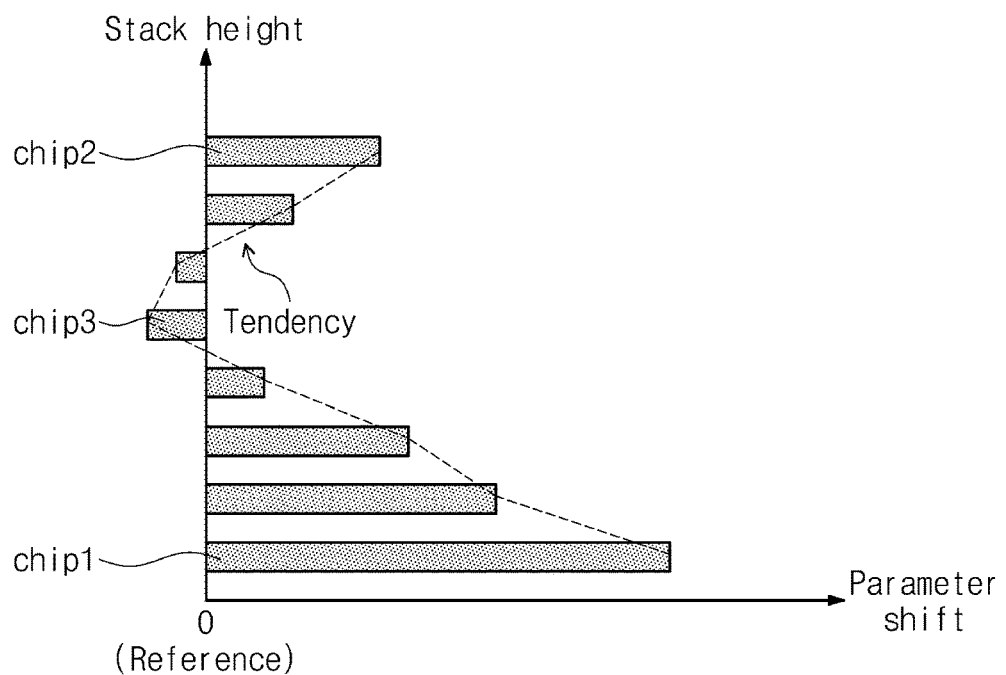

FIGS. 4 and 5 are graphs illustrating a shift of a feature parameter due to a semiconductor package manufacturing process or a semiconductor package assembling process. Referring to FIG. 4, the abscissa denotes a shift of a feature parameter. For example, that a shift of the feature parameter is "0" in the process of manufacturing a semiconductor package means that no physical characteristic of a semiconductor chip changes. In this case, a value of a feature parameter (e.g., a program voltage), which is practically measured from a semiconductor chip, may be the same as a target value originally designed by the memory vendor. That the feature parameter is greatly shifted may mean that a physical characteristic of a semiconductor chip greatly changes and that the probability that an error (e.g., a program fail) is generated due to the shifted feature parameter is high.

A shift of the feature parameter in a semiconductor package process may be the greatest at the lowermost chip (i.e., the first chip chip1) just mounted on a package substrate and the uppermost chip (i.e., the second chip chip2) of a plurality of semiconductor chips. The shift of the feature parameter may be the smallest at a semiconductor chip (e.g., the third chip chip3) that is located in the middle of the semiconductor chips. The shift of the feature parameter of each semiconductor chip has such a tendency as illustrated in FIGS. 4 and 5.

An example in which shifts of the feature parameters of all semiconductor chips are positive is illustrated in FIG. 4. However, embodiments are not limited thereto. For example, as illustrated in FIG. 5, shifts associated with some chips may be negative. For example, in the case where the feature parameter is a program voltage, that the shift of the feature parameter is negative may mean that the program voltage, which is lower than a program voltage originally designed by the memory vendor, is generated. Although not illustrated in FIGS. 4 and 5, shifts of the feature parameters of all chips may be negative. Such a tendency as illustrated in FIG. 4 is maintained even though some of shifts of feature parameters associated with one package are negative or shifts of all feature parameters are negative. In some embodiments, therefore, a shift of a feature parameter of the third chip chip3 may be smaller than shifts of feature parameters of the first and second chips chip1 and chip2.

Figure 6:
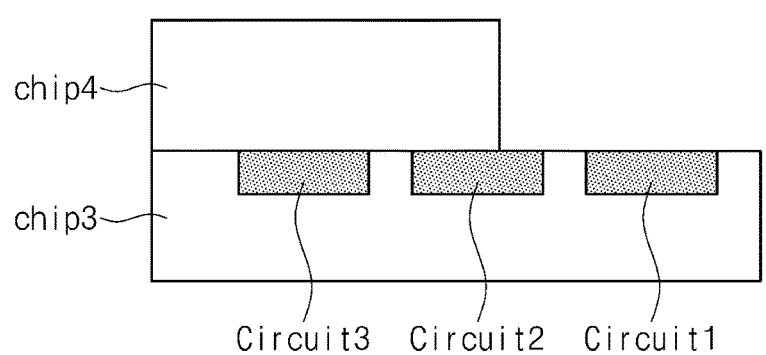
FIG. 6 is a diagram illustrating a part "R" of the semiconductor package illustrated in FIG. 3, according to certain embodiments.
Figure 7:
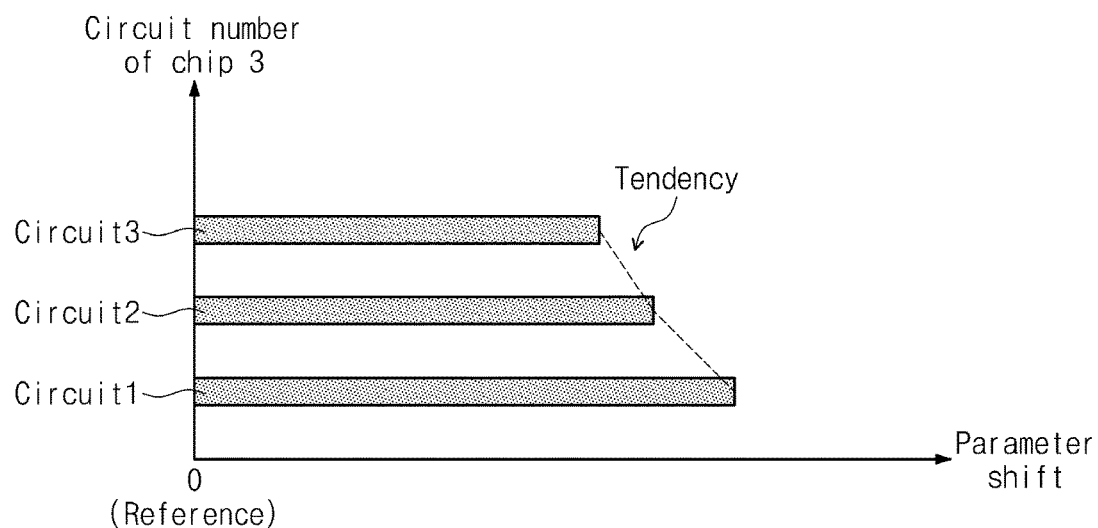
FIG. 7 is a graph illustrating a shift of a feature parameter that is generated according to a circuit location in a third chip.

FIG. 6 is a diagram illustrating a part "R" of the semiconductor package 121 illustrated in FIG. 3. FIG. 7 is a graph illustrating a shift of a feature parameter that is generated according to a circuit location in the third semiconductor chip chip3.

The third chip chip3 of the semiconductor package 121 may include a first circuit Circuit1, a second circuit Circuit2, and a third circuit Circuit3. To help understand the description, it is assumed that the first to third circuits circuit1 to circuit3 have the same functions and configurations. Referring to FIG. 6, the first semiconductor chip chip1 is illustrated as a surface thereof is not covered by the fourth semiconductor chip chip4. The second chip chip2 is illustrated as a part of a surface thereof is covered by the fourth semiconductor chip chip4. The third semiconductor chip chip3 is illustrated as the entirety of a surface thereof is covered by the fourth semiconductor chip chip4.

Even though circuits are included in the same semiconductor chip, mechanical or thermal stresses, which are applied to the first to third circuits circuit1 to circuit3 in the process of manufacturing the semiconductor package 121, may be different from each other. As a result, changes of physical characteristics, which the circuits experience, may be different from each other. For example, fluctuations of the feature parameter of the first circuit Circuit1 may be the greatest, and fluctuations of the feature parameter of the third circuit Circuit3 may be the smallest. In conclusion, fluctuations of the feature parameters of circuits in the third semiconductor chip chip3 may have such a tendency as illustrated in FIG. 7.

Figure 8:
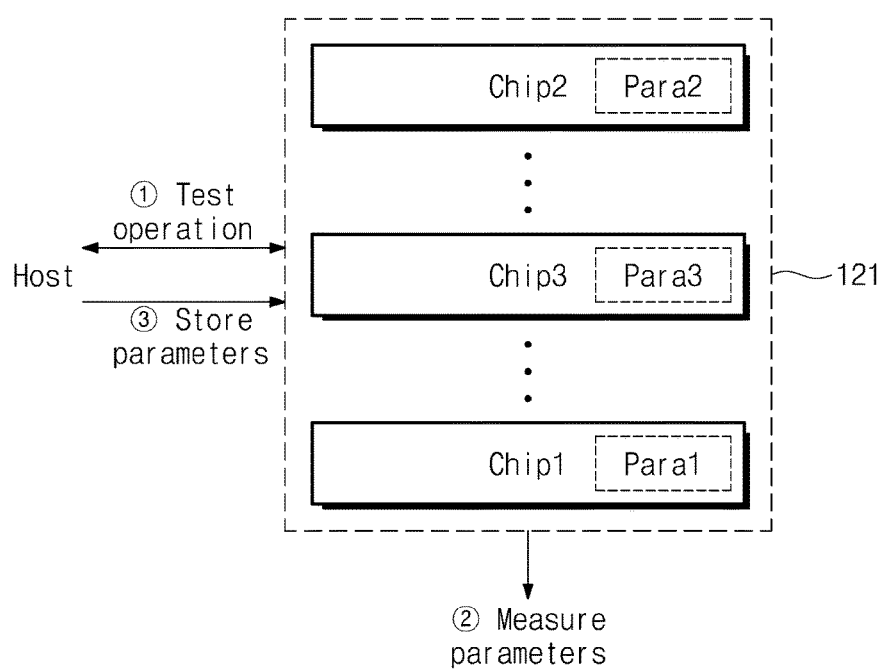
FIGS. 8 and 9 are block diagrams illustrating measuring of a feature parameter from a semiconductor package, according to an embodiment of the inventive concept.

FIG. 8 is a block diagram illustrating measuring of a feature parameter from a semiconductor package, according to an embodiment of the inventive concept. In an embodiment, a test operation, which is performed with respect to the first semiconductor package 121 (refer to FIG. 1), is illustrated in FIG. 8.

A test operation may be performed with respect to the first semiconductor package that is manufactured through a packing process. For a brief description, only three chips, that is, the first chip chip1, the second chip chip2, and the third chip chip3 are illustrated in FIG. 8. As a host is connected to the first semiconductor package 121, various test operations may be performed with respect to each semiconductor chip (①). For example, the host may be test equipment such as automatic test equipment (ATE). The test operation may include the following operations with respect to each semiconductor chip: a program operation, a verification operation, a read operation, an erase operation, a trimming operation (TRIM), and garbage collection.

Feature parameters para1 to para3, which are respectively practically generated in the semiconductor chips, may be measured during the test operation (②). The feature parameter may include voltages needed to perform the above-described operations such as the program operation, the verification operation, the read operation, the erase operation, the trimming operation (TRIM), and the garbage collection. For example, the feature parameter may include a program voltage, a verification voltage, a read voltage, an erase voltage, and a pass voltage. The feature parameter may include a reference voltage for generating the program voltage, verification voltage, read voltage, erase voltage, and pass voltage. In addition, the feature parameter may include an internal voltage needed to drive a logic circuit (or a peripheral circuit) included in each of the memory chips chip1 to chip3. For example, the feature parameter may be measured by separate measurement equipment (not illustrated) through probing.

The measured feature parameters para1 to para3 may be respectively stored in the semiconductor chips (③). For example, the feature parameter para1 measured from the first semiconductor chip chip1 may be stored in a specific area thereof. Likewise, the feature parameter para2 measured from the second semiconductor chip chip2 may be stored in a specific area thereof, and the feature parameter para3 measured from the third semiconductor chip chip3 may be stored in a specific area thereof. The measured feature parameter of each semiconductor chip may be stored in a separate space such as a specific area (for example, an area in which firmware or metadata is stored) of a memory cell array of each semiconductor chip, E-FUSE, or a register. The feature parameters measured from the first to third chips chip1 to chip3 may have such a tendency as illustrated in FIG. 4.

Figure 9:
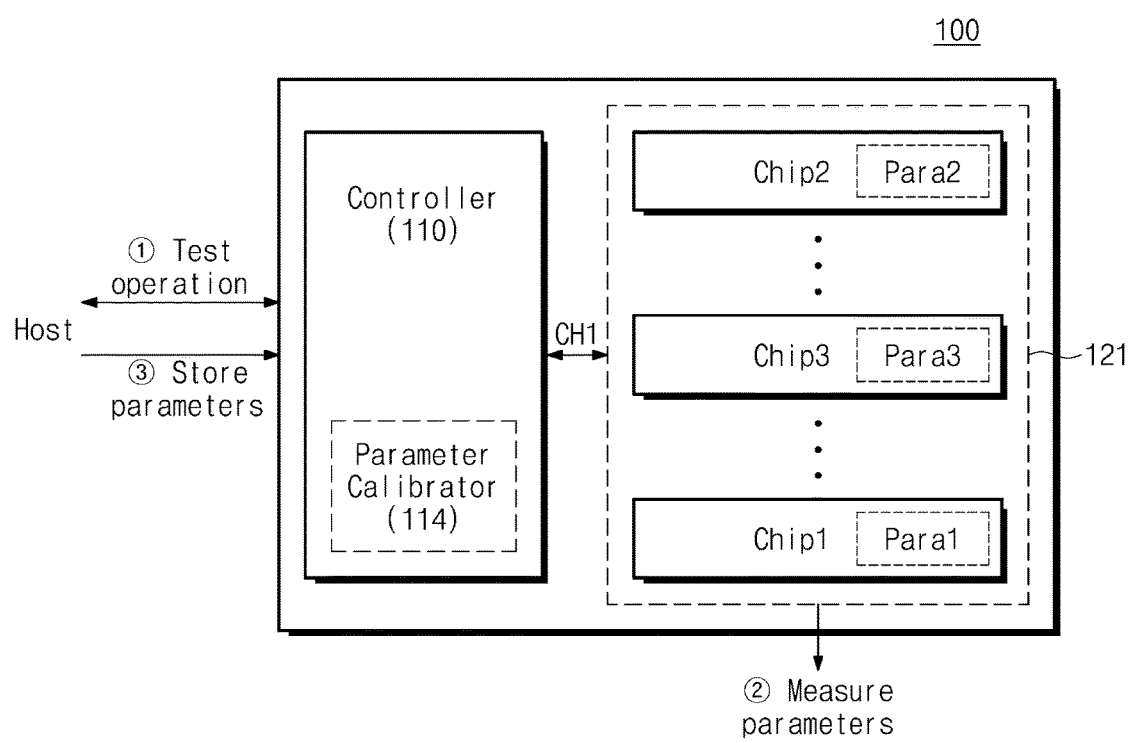

However, as illustrated in FIG. 9, a feature parameter may be measured after a semiconductor package is assembled in the data storage device 100, as well as after the semiconductor package is manufactured. For descriptive convenience, an embodiment is illustrated in FIG. 9 as only the first semiconductor package 121 is connected to the controller 110 through the first channel CH1. However, the remaining semiconductor packages (not illustrated) may be respectively connected to the controller 110 through separate channels. A test operation associated with the data storage device 100 is substantially the same as or similar to that described with reference to FIG. 8, and thus, a description thereof will not be repeated here.

Figure 10:
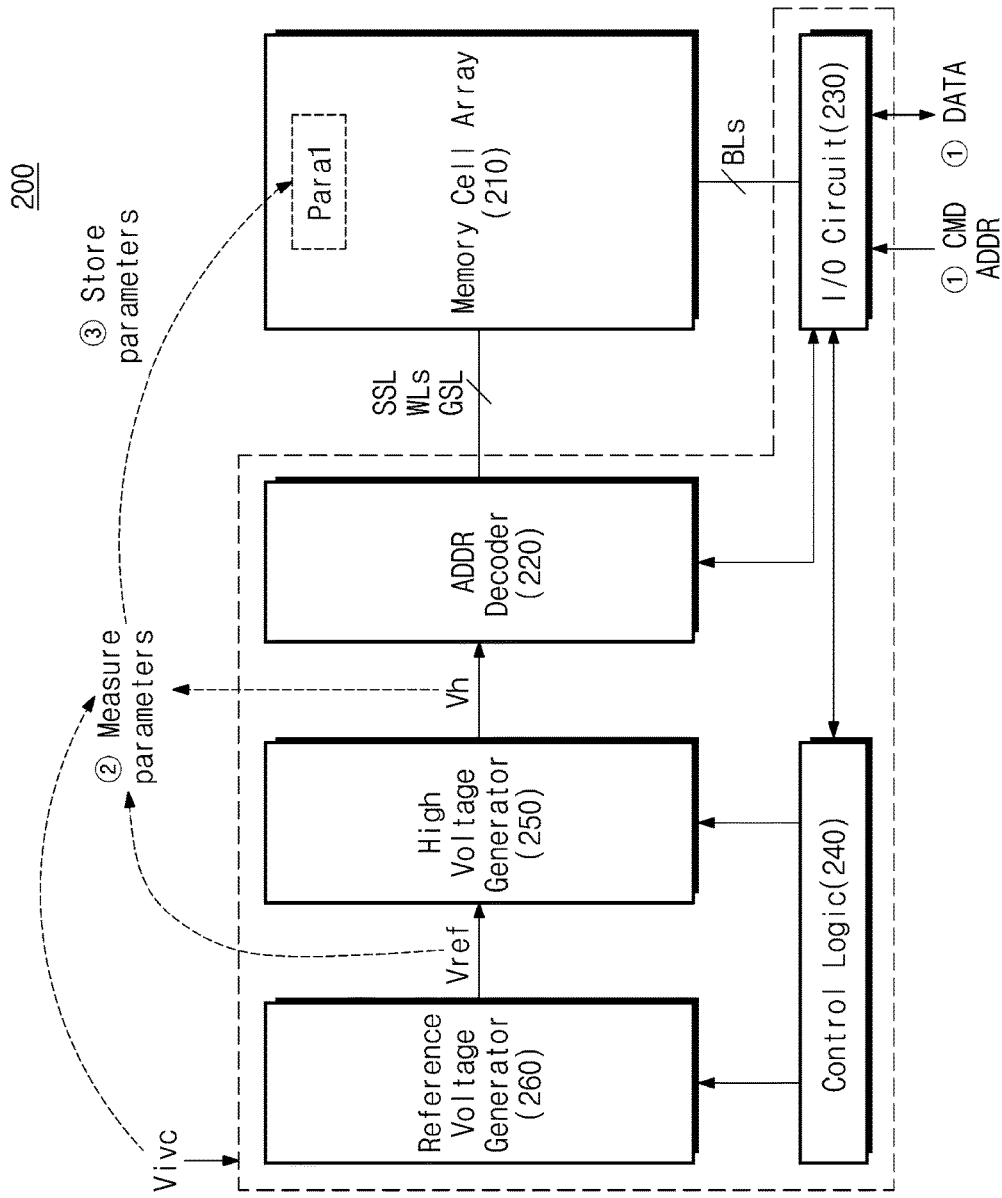
FIG. 10 is a block diagram illustrating one of semiconductor chips illustrated in FIG. 8 or 9, according to certain embodiments.

FIG. 10 is a block diagram illustrating one of the semiconductor chips chip1 to chip3 illustrated in FIG. 8 or 9. Referring to FIG. 10, a semiconductor chip 200 may include a memory cell array 210, an address decoder 220, an input/output circuit 230, control logic 240, a high voltage generator 250, and a reference voltage generator 260.

The memory cell array 210 may include a plurality of memory blocks. Each of the memory blocks may include a plurality of cell strings. Each of the cell strings may include a plurality of memory cells. The memory cells may be connected with a plurality of word lines WLs. Each memory cell may be a single level cell (SLC) storing one bit, a multi-level cell (MLC) storing at least two bits, or a triple-level cell (TLC). A plurality of string selection transistors may be connected with at least one selection lines SSL, and a plurality of ground selection transistors may be connected with at least one ground selection line GSL The address decoder 220 may be connected with the memory cell array 210 through the word lines WL, string selection lines SSL, and ground selection lines GSL. The address decoder 220 may receive and decode an addresses ADDR from the controller 110 (refer to FIG. 1) and may select at least one of the word lines WLs based on the decoded address. In this case, the selected word line may be driven. The address decoder 220 may decode a column address of the received address ADDR. The decoded column address may be provided to the input/output circuit 230. For example, although not illustrated in FIG. 10, the address decoder 220 may include a row decoder, a column decoder, an address buffer, etc.

The input/output circuit 230 may be connected to the memory cell array 210 through bit lines BL. The input/output circuit 230 may be configured to receive the decoded column address from the address decoder 220. The input/output circuit 230 may select bit lines based on the decoded column address.

During a write operation, the input/output circuit 230 may receive data "DATA" from the controller 110 and may store the received data "DATA" in the memory cell array 210. During a read operation, the input/output circuit 230 may read data from the memory cell array 210 and may output the read data to the outside.

The control logic 240 may control a program operation, a read operation, an erase operation, etc. with respect to the semiconductor chip 200, based on a command CMD and an addresses ADDR from the controller 110.

The high voltage generator 250 may generate a high voltage Vh such as a program voltage, a verification voltage, a read voltage, an erase voltage, or a pass voltage. The high voltage Vh generated by the high voltage generator 250 may be supplied to the address decoder 220 to drive at least one of the word lines. In this case, various operations such as a program operation, a read operation, and an erase operation may be performed with respect to the memory cell array 210.

The reference voltage generator 260 may generate a reference voltage Vref that is needed for the high voltage generator 250 to generate the high voltage Vh. The reference voltage generator 260 may generate the reference voltage Vref by using electric power from an external device such as a power management integrated circuit (PMIC). For example, an external voltage, which is supplied from the PMIC placed outside of the semiconductor chip 200, may be converted into an internal voltage Vivc through a voltage regulator (not illustrated). The internal voltage Vivc may be used for the reference voltage generator 260 to generate the reference voltage Vref.

During a test operation according to an embodiment of the inventive concept, feature parameters may be respectively measured from semiconductor chips constituting a semiconductor package (②). For example, the feature parameter may include the high voltage Vh generated by the high voltage generator 250, the reference voltage Vref generated by the reference voltage generator 260, etc. Also, the feature parameter may further include the internal voltage Vivc that is needed to drive a peripheral circuit including at least one of the address decoder 220, the input/output circuit 230, the control logic 240, the high voltage generator 250, and the reference voltage generator 260. Furthermore, although not illustrated in FIG. 10, the feature parameter may further include a precharge voltage for driving a bit line, a common source line voltage for driving a common source line (CSL), a temperature compensation offset, an incremental step pulse programming (ISPP) voltage, etc. Such feature parameters may be measured by using separate measurement equipment upon testing of a semiconductor package. As can be seen, many feature parameters described herein may relate to voltages, and therefore may be generally referred to as voltage parameters. Also, the feature parameters determined during testing and stored in a memory chip, as discussed further below, may be referred to herein as tested feature parameters, stored tested feature parameters, or measured feature parameters.

The measured feature parameters Para1 may be stored in a specific area of the memory cell array 210 (③). An embodiment is illustrated in FIG. 10 as the measured feature parameters Para1 are stored in the memory cell array 210. However, embodiments are not limited thereto. For example, the feature parameters Para1 may be stored in a separate space such as E-FUSE (not illustrated) or a register (not illustrated). As such, semiconductor chips may be delivered by a memory vendor while feature parameters of the semiconductor chips measured during a test operation of a semiconductor package are respectively stored in the semiconductor chips.

Figure 11:
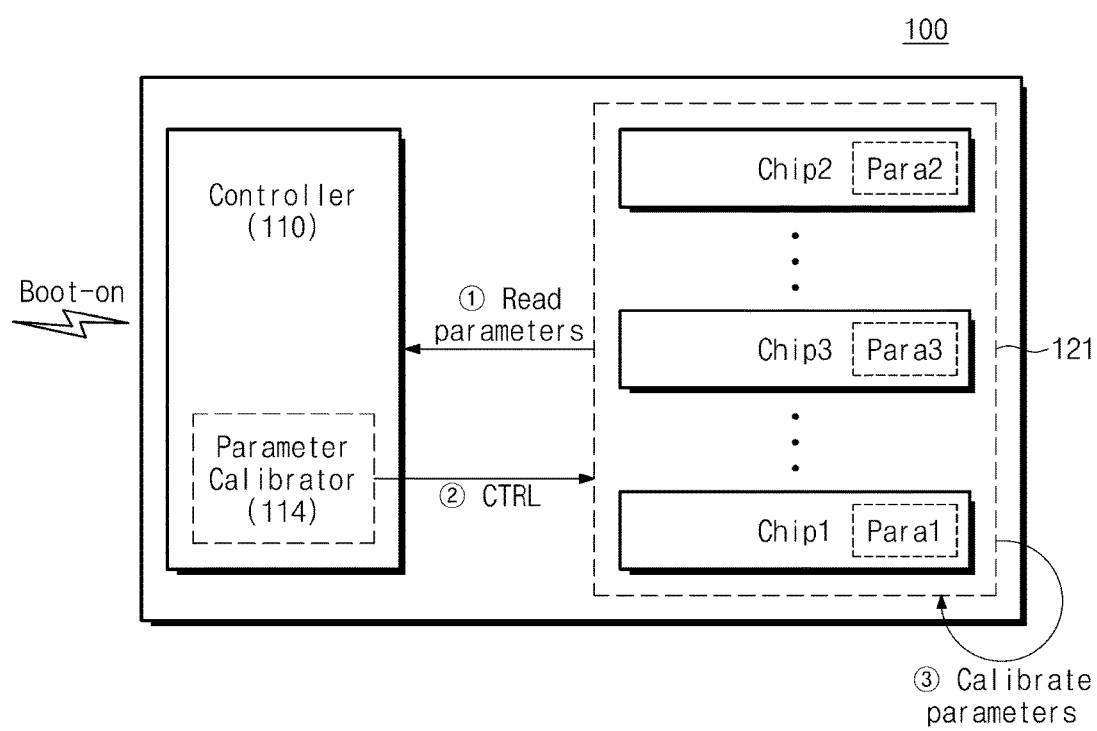
FIG. 11 is a block diagram illustrating how a feature parameter is calibrated on a data storage device, according to an embodiment of the inventive concept.

FIG. 11 is a block diagram illustrating how a feature parameter is calibrated on a data storage device, according to an embodiment of the inventive concept. The data storage device 100 may include a controller 100 and a plurality of semiconductor packages. The controller 110 may include the parameter calibrator 114. For descriptive convenience, the first semiconductor package 121 is illustrated in FIG. 11. Also, the first to third semiconductor chips chip1 to chip3 among a plurality of semiconductor chips constituting the first semiconductor package 121 are illustrated in FIG. 11.

When the data storage device 100 is booted on, feature parameters respectively stored in the semiconductor chips chip1 to chip3 may be read out (①). Also, target values, which are respectively stored in specific spaces (e.g., E-FUSE, etc.) of the semiconductor chips chip1 to chip3, may be read together with the feature parameters. Here, a target value may refer to a value associated with a physical characteristic of a semiconductor chip originally designed by the memory vendor. The read feature parameters para1 to para3 may have such a tendency as described with reference to FIGS. 4 and 5.

The parameter calibrator 114 may generate a control signal CTRL for controlling each semiconductor chip such that each semiconductor chip produces a target value originally designed by the memory vendor (②). For example, the parameter calibrator 114 may generate the control signal CTRL based on the read target value and feature parameter value. The controller 110 may control each semiconductor chip by using the control signal CTRL such that a feature parameter value of each semiconductor chip is the same as a target value originally designed by the memory vendor (③). Thus, although the stored tested feature parameter value may indicate the feature parameter value during testing, using the stored tested feature parameter value and the read target value, the parameter calibrator 114 may adjust settings so that an actual used feature parameter is adjusted to have the same value as the target value. This actual used feature parameter value may be referred to herein as an adjusted feature parameter value, for example, which has been adjusted to match the target value. It should be noted that while the feature parameter may be adjusted to have a value that matches the target value, in practice, it may not exactly match the target value, but may be the same as the target value within a small margin of error that does not significantly affect the operation of the chip or storage device.

The parameter calibrator 114 may be loaded on a memory such as an SRAM (not illustrated) in the controller 110 and may be driven in the form of firmware or software. Alternatively, the parameter calibrator 114 may be loaded on a separate DRAM (not illustrated) and may be driven in the form of firmware or software. Alternatively, the parameter calibrator 114 may be a semiconductor chip that is implemented with separate hardware.

An embodiment is exemplified as during booting-on of the data storage device 100, a stored feature parameter is read and a semiconductor chip is controlled such that a value of the feature parameter in operation is the same as a target value. However, timing when a semiconductor chip is controlled may be determined variously. For example, a semiconductor chip may be controlled upon wake-up from a power saving mode or may be controlled during an idle time when a host request does not exist.

Figure 12:
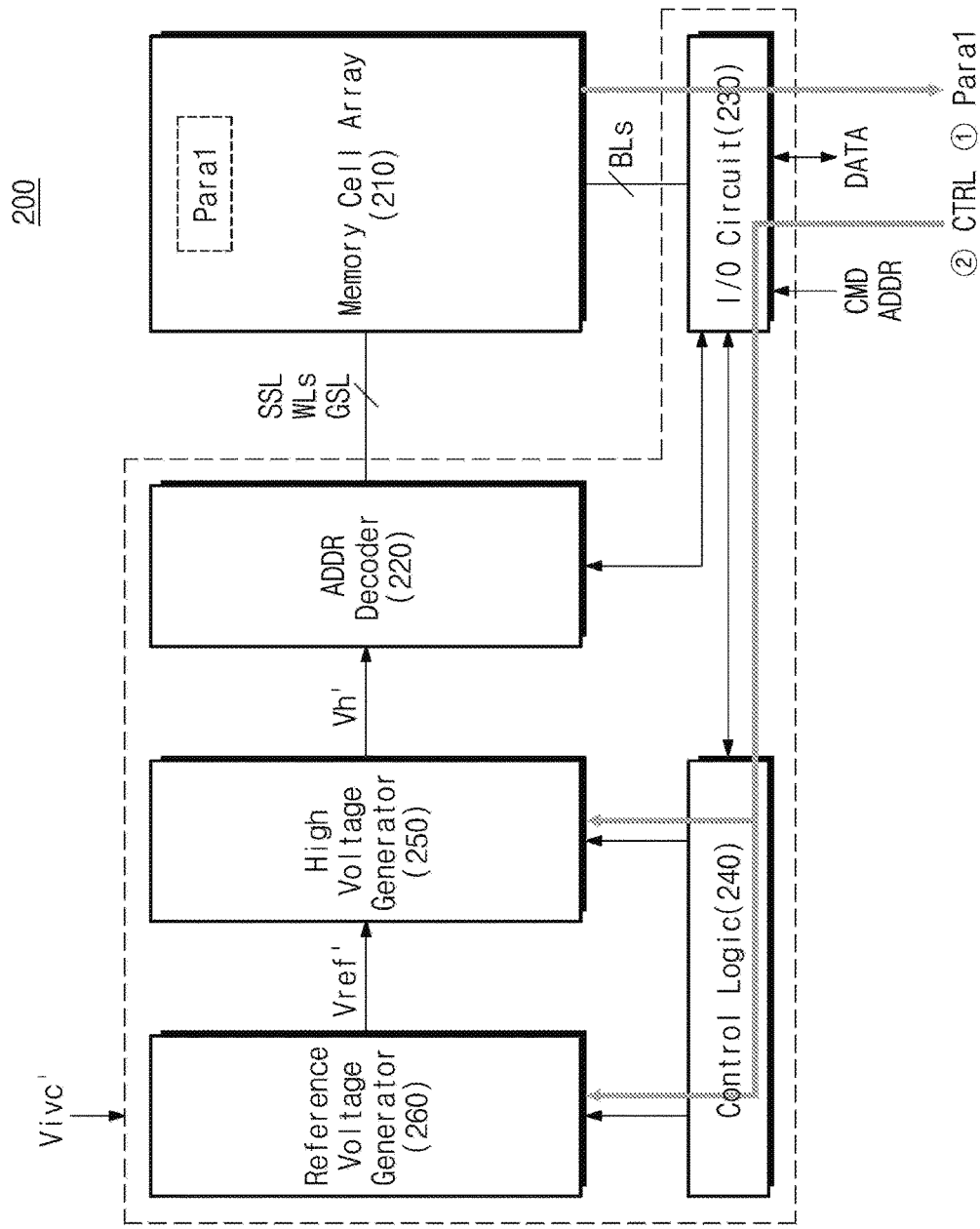
FIG. 12 is a block diagram for describing how a first semiconductor chip of the data storage device illustrated in FIG. 11 is controlled, according to certain embodiments.

FIG. 12 is a block diagram for describing how the first semiconductor chip of the data storage device 100 illustrated in FIG. 11 is controlled, according to one embodiment. The first feature parameter para1 is read from the memory cell array 210 upon booting-on (①). Although not illustrated in FIG. 12, a target value stored in E-FUSE or the like may be read out together with the first feature parameter para1. The target value may be a physical value originally designed by the memory vendor. The control signal CTRL, which is generated by the parameter calibrator 114 of the controller 110 (refer to FIG. 9), may be transmitted to the input/output circuit 230, and the control logic 240 (e.g., a control circuit) may provide the control signal CTRL to the high voltage generator 250 or the reference voltage generator 260 (②). As a result, the reference voltage Vref, which is generated according to the control signal CTRL, may be the same as a reference voltage designed by the memory vendor. In this manner, the voltage Vref may be adjusted based on the control signal CTRL generated by the parameter calibrator 114, which is in turn based on a comparison between the stored value of the first feature parameter para1 and a stored target value for the first feature parameter. A high voltage Vh', which is generated by the high voltage generator 250 in response to the control signal CTRL, and an internal voltage Vivc' for driving a peripheral circuit may be also calibrated according to the above-described manner. Here a single quotation mark attached to the reference voltage Vref', the high voltage Vh', the internal voltage Vivc', etc. refers to voltages that have been are calibrated by the parameter calibrator 114.

In some embodiments, the parameter calibrator 114 may control each semiconductor chip such that a feature parameter value is different from a target value originally designed by the memory vendor. For example, as the number of program-erase (P/E) cycles of memory blocks constituting a memory cell array increases, the degree of deterioration of each memory block may increase. Accordingly, the parameter calibrator 114 may control each semiconductor chip such that a feature parameter value is different from a target value, in consideration of the number of P/E cycles of memory blocks in the semiconductor chip. For example, a value of a feature parameter in a semiconductor chip may be greater or smaller than a target value originally designed by the memory vendor, under control of the parameter calibrator 114.

In another example, operating performance of the data storage device 200 may be affected by a temperature of a periphery. Accordingly, the parameter calibrator 114 may control each semiconductor chip such that an actual used feature parameter value is different from a target value, in consideration of the value of the temperature of the periphery. For example, a value of an actual used feature parameter in a semiconductor chip may be greater or smaller than a target value originally designed by the memory vendor, under control of the parameter calibrator 114. To this end, the data storage device 200 or a semiconductor chip may include a temperature sensor.

In another example, the parameter calibrator 114 may control each semiconductor chip such that a feature parameter value is different from a target value, in consideration of the number of error bits generated during a read operation. For example, when the number of error bits generated during the read operation is greater than or equal to a threshold value, a value of an actual used feature parameter in a semiconductor chip may be set to be greater or smaller than a target value originally designed by the memory vendor, under control of the parameter calibrator 114.

Various feature parameters are described with regard to a voltage. However, embodiments are not limited thereto. Other embodiments will be described, for example, with reference to FIGS. 13 to 15.

Figure 13:
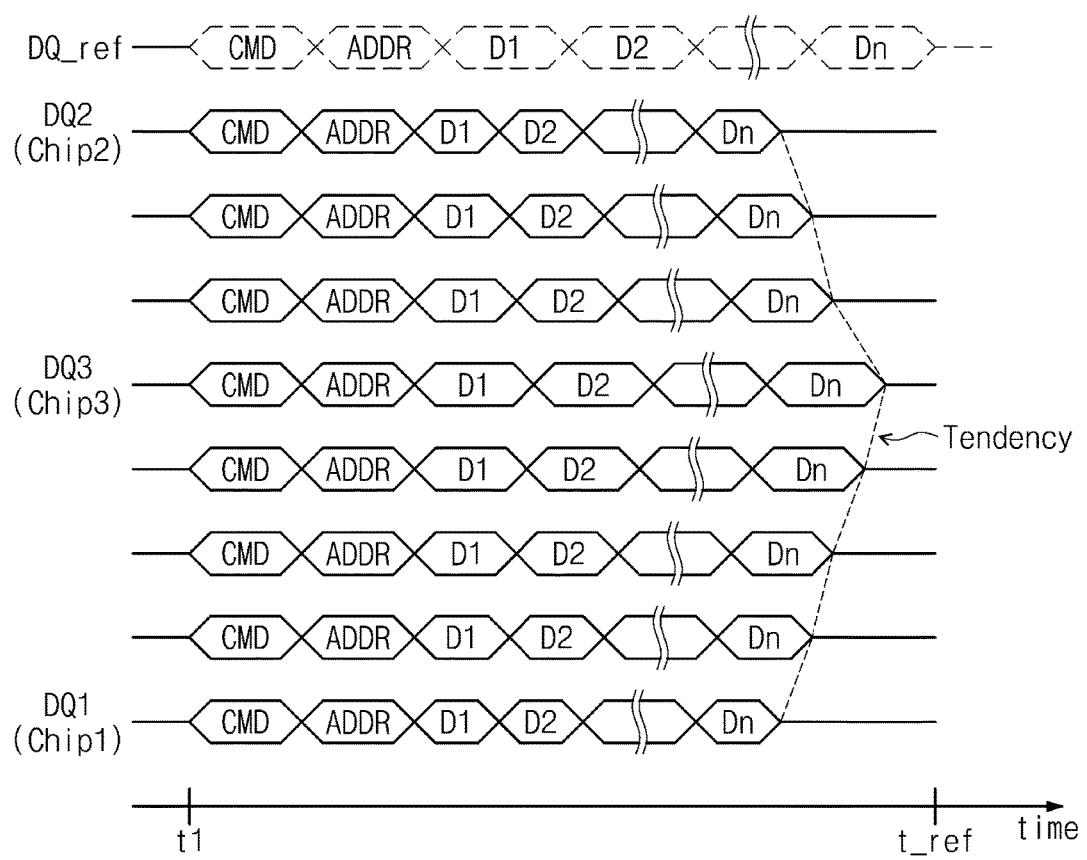
FIG. 13 is a diagram illustrating an example in which a data strobe signal is transmitted from a controller to a semiconductor chip.

FIG. 13 is a diagram illustrating an example in which a data strobe signal DQ is transmitted from the controller 110 (refer to FIG. 11) to a semiconductor chip. To help understanding, a description will be given with reference to FIGS. 3 and 4.

The uppermost data strobe signal DQ_ref among data strobe signals illustrated in FIG. 13 may be a data strobe signal originally designed by the memory vendor. A first data strobe signal DQ1 is a data strobe signal that is input to the first semiconductor chip chip1 from a controller, a second data strobe signal DQ2 is a data strobe signal that is input to the second semiconductor chip chip2 from the controller, and a third data strobe signal DQ3 is a data strobe signal that is input to the third semiconductor chip chip3 from the controller. To help understanding, it is assumed that data strobe signals are each composed of the same command CMD, address ADDR, and data D1 to Dn are respectively input to semiconductor chips at the same timing.

As described above, a physical characteristic of each semiconductor chip may be changed due to a mechanical or thermal stress generated in the process of manufacturing a semiconductor package. For example, a toggling period of a data strobe signal measured in each semiconductor chip may be changed. For example, referring to FIG. 13, a toggling frequency for each reference period measured with respect to each of the first and second data strobe signals DQ1 and DQ2 is relatively great. In contrast, a toggling frequency for each reference period measured with respect to the third data strobe signal DQ3 is less than that measured with respect to each of the remaining data strobe signals. As a result, a tendency of a shift of a toggling frequency may be similar to that of FIG. 4 or 5. In each semiconductor chip, a toggling frequency for each reference period may be measured upon testing of a semiconductor package, and the measured toggling frequency may be stored in a specific area of each semiconductor chip (e.g., as a tested feature parameter value).

Figure 14:
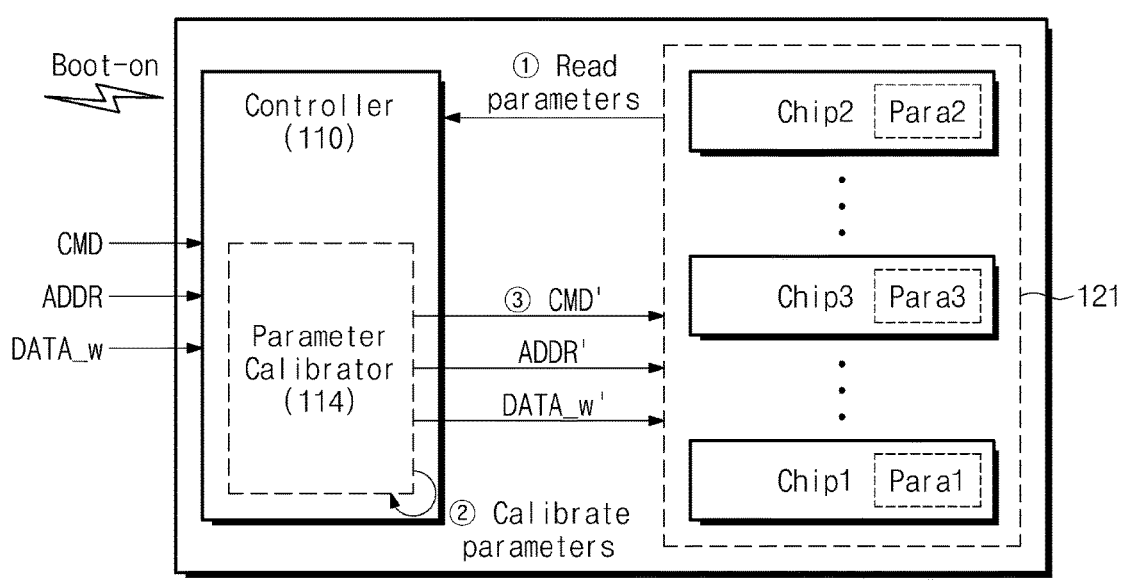
FIG. 14 is a block diagram for describing how each semiconductor chip is controlled, according to an embodiment of the inventive concept.

FIG. 14 is a block diagram for describing how each semiconductor chip is controlled, according to an embodiment of the inventive concept. For example, a feature parameter to be described in FIG. 14 is a toggling frequency of a data strobe signal for each reference period described with reference to FIG. 13. To help understanding, a description will be given with reference to FIGS. 2, 4, 13, and 14.

The data storage device 100 may include the controller 110 and a plurality of semiconductor packages. The controller 110 may include the parameter calibrator 114. The parameter calibrator 114 may be loaded on the SRAM 113 in the controller 110 and may be driven in the form of firmware or software. Alternatively, the parameter calibrator 114 may be loaded on the separate DRAM 130 and may be driven in the form of firmware or software. Alternatively, the parameter calibrator 114 may be a semiconductor chip that is implemented with separate hardware.

For descriptive convenience, the first semiconductor package 121 is illustrated in FIG. 14. Also, the first to third semiconductor chips chip1 to chip3 among a plurality of semiconductor chips constituting the first semiconductor package 121 are illustrated in FIG. 14. The first to third semiconductor chips chip1 to chip3 may be connected to the controller 110 through a shared channel (not illustrated). The first to third semiconductor chips chip1 to chip3 illustrated in FIG. 14 may correspond to the first to third semiconductor chips chip1 to chip3 illustrated in FIG. 3, respectively.

First, a control of a write operation will be described. When the data storage device 100 is booted on, feature parameters para1 to para3 (e.g., tested feature parameters) respectively stored in the semiconductor chips chip1 to chip3 may be read out (①). Also, target values, which are respectively stored in specific spaces (e.g., E-FUSE, etc.) of the semiconductor chips chip1 to chip3, may be read together with the feature parameters. A target value may be a value (i.e., a toggling frequency of a data strobe signal for each reference period) that is associated with a physical characteristic of a semiconductor chip originally designed by the memory vendor. The read tested feature parameters para1 to para3 may be stored in a separate storage space (e.g., a DRAM or an SRAM) in the controller 110. In this case, values of the tested feature parameters para1 to para3 may be different from each other. For example, the tested feature parameters para1 to para3 read from the semiconductor chips chip1 to chip3 may have such a tendency as described with reference to FIGS. 4 and 5.

Assuming that the same data strobe signals are respectively transmitted to the semiconductor chips chip1 to chip3, the data strobe signals being transmitted (or data strobe signals before transmitted to the semiconductor chips chip1 to chip3) may have the same toggling frequencies for each reference period. However, toggling frequencies for each reference period may be different from each other in the semiconductor chips chip1 to chip3. For example, a toggling frequency para1 for each reference period, which is associated with a data strobe signal sent to the first semiconductor chip chip1, and a toggling frequency para2 for each reference period, which is associated with a data strobe signal sent to the second semiconductor chip chip2, may be greater than a toggling frequency para3 for each reference period, which is associated with a data strobe signal sent to the third semiconductor chip chip3.

The parameter calibrator 114 may be used to make a toggling frequency of a data strobe signal for each reference period equal in the semiconductor chips chip1 to chip3. For example, if the controller 110 receives a command CMD, an address ADDR, and write data DATA_w according to a write request from a host (not illustrated), the parameter calibrator 114 may calibrate a toggling frequency of a data strobe signal for each reference period based on the read feature parameters para1 to para3.

For example, it is assumed that a toggling frequency of a data strobe signal for each reference period originally designed by the memory vendor is "100" and a toggling frequency of a data strobe signal for each reference period, which is measured in the process of testing the first semiconductor package 121 and corresponds to the first semiconductor chip chip1, is "101". That is, a feature parameter value stored in the first semiconductor chip chip1 in the process of testing the first semiconductor package 121 is "101" and a feature parameter value read from the first semiconductor chip chip1 upon booting-on of the data storage device 100 is "101." The parameter calibrator 114 may calibrate the first data strobe signal DQ1 such that a toggling frequency of the first data strobe signal DQ1 for each reference period corresponding to the first semiconductor chip chip1 is set to "100". That is, when the calibrated first data strobe signal DQ1', which is composed of a command CMD', an address ADDR', and write data DATA_w' is sent to the first semiconductor chip chip1 from the controller 110, a toggling frequency for each reference period corresponding to the first semiconductor chip chip1 may be "100" (③). Here, a single quotation mark attached to a command, an address, write data, etc. may mean that signals have been calibrated by the parameter calibrator 114.

The above-described operation may be applied to the second and third data strobe signals DQ2' and DQ3' respectively being sent to the second and third semiconductor chips chip2 and chip3. As a result, the first to third data strobe signals DQ1' to DQ3' respectively sent to the first to third semiconductor chips chip1 to chip3 may have the same toggling frequencies for each reference period.

As such, in various embodiments, a first semiconductor chip may have a first measured feature parameter value (e.g., 101) for a first particular feature parameter (e.g., toggling frequency), the second semiconductor chip is arranged on the first semiconductor chip and has a second measured feature parameter value for the first particular feature parameter (e.g., toggling frequency), and the third semiconductor chip is arranged between the first and second semiconductor chips and has a third measured feature parameter value for the first particular feature parameter (e.g., toggling frequency). Using each of these measured feature parameter values along with a target value for each semiconductor chip respectively, the actual feature parameter value used during operation can be set differently among the semiconductor chips of the same package. The above-described operation may be applicable to a read operation, which will be described with reference to FIG. 15.

Figure 15:
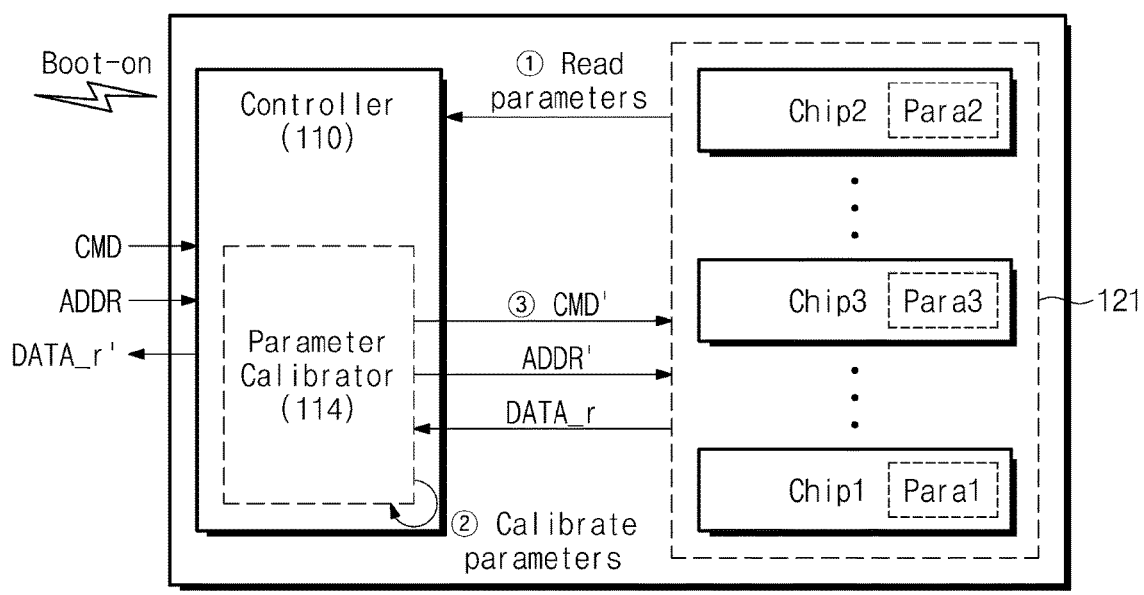
FIG. 15 is a block diagram illustrating how a feature parameter is calibrated on a data storage device, according to an embodiment of the inventive concept.

FIG. 15 is a block diagram illustrating how a feature parameter is calibrated on the data storage device 100, according to an embodiment of the inventive concept. To help understanding, a control of a read operation will be given with reference to FIGS. 2, 4, 13, and 15.

When the data storage device 100 is booted on, feature parameters para1 to para3 are respectively read from the semiconductor chips chip1 to chip3 (①). Also, target values, which are respectively stored in specific spaces (e.g., E-FUSE, etc.) of the semiconductor chips chip1 to chip3, may be read together with the feature parameters. A target value may be a value (i.e., a toggling frequency of a data strobe signal for each reference period) that is associated with a physical characteristic of a semiconductor chip originally designed by the memory vendor. Afterwards, when a command CMD and an address ADDR are received according to a read request from a host, the parameter calibrator 114 may calibrate the first data strobe signal DQ1 composed of the command CMD and the address ADDR (②). A first data strobe signal DQ1', which is calibrated by the parameter calibrator 114 and is composed of a command CMD' and an address ADDR', may be sent to the first semiconductor chip chip1 (③). In the first semiconductor chip chip1, a toggling frequency of the first data strobe signal DQ1' for each reference period may be the same as a target value originally designed by the memory vendor.

Afterwards, read data DATA_r, which is read from the first semiconductor chip chip1 but is not calibrated, may be sent to the controller 110 through the nonvolatile memory interface 117. The read data DATA_r may be calibrated by the parameter calibrator 114 before being provided to a user. As a result, the calibrated read data DATA_r' may be the same as a toggling frequency for each reference period originally designed by the memory vendor. Even though pieces of read data DATA_r from the semiconductor chips chip1 to chip3 have different toggling frequencies, pieces of the read data DATA_r' may have the same toggling frequencies under control of the parameter calibrator 114, for example, based on inputting the stored target value and stored tested feature parameter value to the parameter calibrator 114. Accordingly, it may be possible to provide the user with read data that is more intact.

Figure 16:
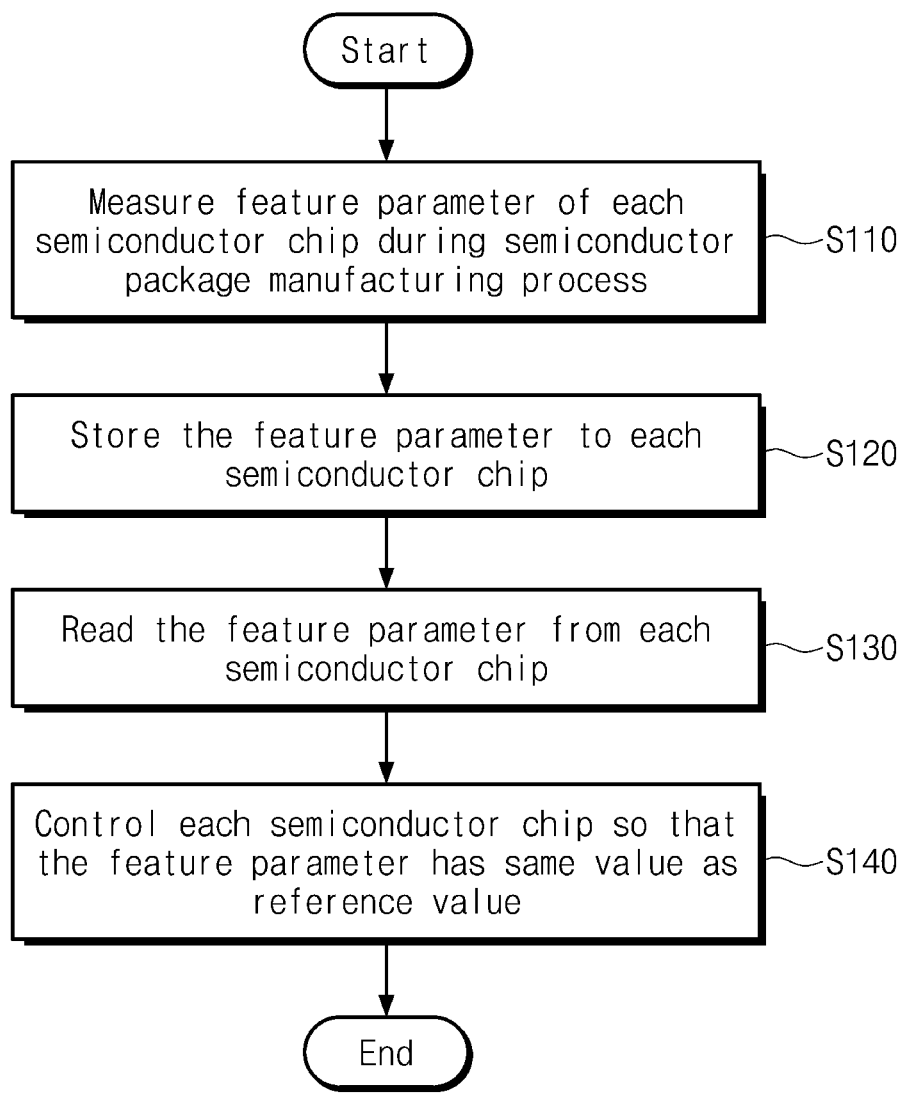
FIG. 16 is a flowchart illustrating an operating method of a data storage device according to an embodiment of the inventive concept.

FIG. 16 is a flowchart illustrating an operating method of the data storage device according to an embodiment of the inventive concept. As described above, a data storage device may include a multi-stack chip package in which a plurality of semiconductor chips are mounted on a package substrate and may include first, second, and third semiconductor chips.

In operation S110, physical values associated with the semiconductor chips, that is, feature parameters may be measured from the semiconductor chips. For example, the feature parameters may be measured when or after the first to third semiconductor chips are mounted on a package substrate. For example, the feature parameters may be measured by separate test equipment in the process of testing a multi-stack chip. For example, values of the feature parameters respectively from the semiconductor chips may be different from each other. A value of the feature parameter measured from a first semiconductor chip the most adjacent to the package substrate and a value of the feature parameter measured from the uppermost semiconductor chip, that is, a second semiconductor chip may be greater than a value of the feature parameter measured from a third semiconductor chip between the first semiconductor chip and the second semiconductor chip.

For example, the feature parameter may include various factors associated with an operation of a semiconductor chip. For example, the feature parameter may include a program voltage, a verification voltage, a read voltage, an erase voltage, a pass voltage, a reference voltage used to generate them. For example, the feature parameter may include an internal voltage needed to drive logic elements constituting a semiconductor chip. For example, the feature parameter may include a precharge voltage for driving a bit line, a common source line voltage for driving a common source line, a temperature compensation offset, an ISPP voltage, etc. Furthermore, the feature parameter may include a toggling frequency for each reference period, which is associated with a data strobe signal to be sent to each semiconductor chip.

In operation S120, the measured feature parameters may be stored in the semiconductor chips, respectively. For example, a measured feature parameter may be stored in a specific area (e.g., a memory cell array, E-FUSE, a separate register, etc.) of a semiconductor chip from which the feature parameter is measured.

In operation S130, the feature parameters stored in the semiconductor chips may be read upon booting-on of a data storage device. Also, target values, which are respectively stored in specific spaces (e.g., E-FUSE, etc.) of the semiconductor chips chip1 to chip3, may be read together with the feature parameters. Here, a target value may refer to a value associated with a physical characteristic of a semiconductor chip originally designed by the memory vendor. Values of the read feature parameters may be stored in a storage space (e.g., an SRAM, a DRAM, or a separate register) in a controller.

In operation S140, each semiconductor chip may be controlled such that a feature parameter value is the same as a reference value. The reference value may be a target value, as discussed above, but is not limited thereto, and may be a different pre-set value used to control an adjustment of the feature parameter. For example, a difference (also referred to as a "first feature difference") between a reference (e.g., target) value and a value of the feature parameter read from the first semiconductor chip may be greater than a difference (also referred to as a "third feature difference") between a reference value and a value of the feature parameter read from the third semiconductor chip. A difference (also referred to as a "second feature difference") between the reference value and a value of the feature parameter read from the second semiconductor chip may be greater than a difference (i.e., "third feature difference") between the reference value and a value of the feature parameter read from the third semiconductor chip. For example, shifts of feature parameters calibrated by controlling the first and second semiconductor chips may be greater than a shift of a feature parameter calibrated by controlling the third semiconductor chip.

In certain embodiments, operation S140 may be performed immediately upon booting-on of the data storage device. Alternatively, operation S140 may be performed during an idle time of the data storage device. Alternatively, operation S140 may be performed when the data storage device is woken up from the power saving mode.

For example, operation S140 may be performed in consideration of the number of program-erase (P/E) cycles of each semiconductor chip. According to one embodiment, a ground rule is that a semiconductor chip is controlled such that a value of a feature parameter is the same as a target value. However, in some embodiments, a semiconductor chip may be controlled such that a value of a feature parameter is different from a target value. For example, as the number of P/E cycles of a memory block in a semiconductor chip increases, the degree of deterioration of the semiconductor chip may increase. Accordingly, when the number of P/E cycles exceeds a specific threshold value, each semiconductor chip may be controlled such that a value of a feature parameter is greater or smaller than a target value.

For example, operation S140 may be performed in consideration of a temperature of a periphery of each semiconductor chip. For example, the temperature of the periphery may affect the degree of deterioration or feature parameter of a semiconductor chip. Accordingly, when the temperature of the periphery exceeds a specific threshold temperature or is lower than the specific threshold temperature, each semiconductor chip may be controlled such that a value of a feature parameter is greater or smaller than a target value. To this end, each semiconductor chip may include a temperature sensor.

For example, operation S140 may be performed in consideration of a rate of error bits generated when a read operation is performed with respect to each semiconductor chip. For example, when the bit error rate exceeds a specific threshold value, each semiconductor chip may be controlled such that a value of a feature parameter is greater or smaller than a target value.

According to the above-described operating method of the data storage device, a semiconductor chip may be controlled such that a value of a feature parameter of each semiconductor chip varied in a multi-stack chip package manufacturing process is the same as a target value originally designed by the memory vendor. This may be executed in consideration of the number of P/E cycles, a temperature of a periphery, or a bit error rate, but calibration may be made to secure the reliability of the data storage device.

Figure 17:
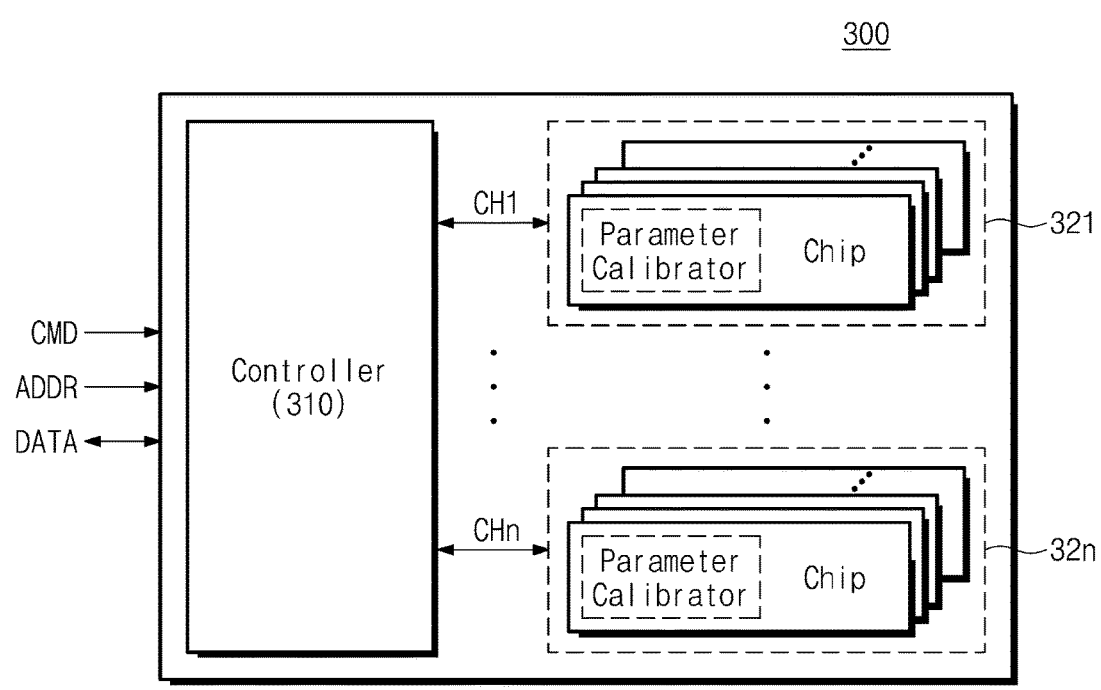
FIG. 17 is a block diagram illustrating a data storage device according to embodiments of the inventive concept.

FIG. 17 is a block diagram illustrating a data storage device 300 according to an embodiment of the inventive concept. Referring to FIG. 17, the data storage device 300 may include a controller 310 and a plurality of semiconductor packages 321 to 32n. The semiconductor packages 321 to 32n may be connected to the controller 310 through a plurality of channels CH1 to CHn, respectively.

Each semiconductor package may include a plurality semiconductor chips mounted on a package substrate, for example, by a wire bonding method, flip-chip method, or other known method. Each semiconductor chip may include a parameter calibrator. Embodiments are illustrated in FIGS. 1 to 13 as a feature parameter of each semiconductor chip is calibrated through a parameter calibrator implemented in a controller. Below, embodiments in which the parameter calibrator is implemented in each semiconductor chip will be described.

Figure 18:
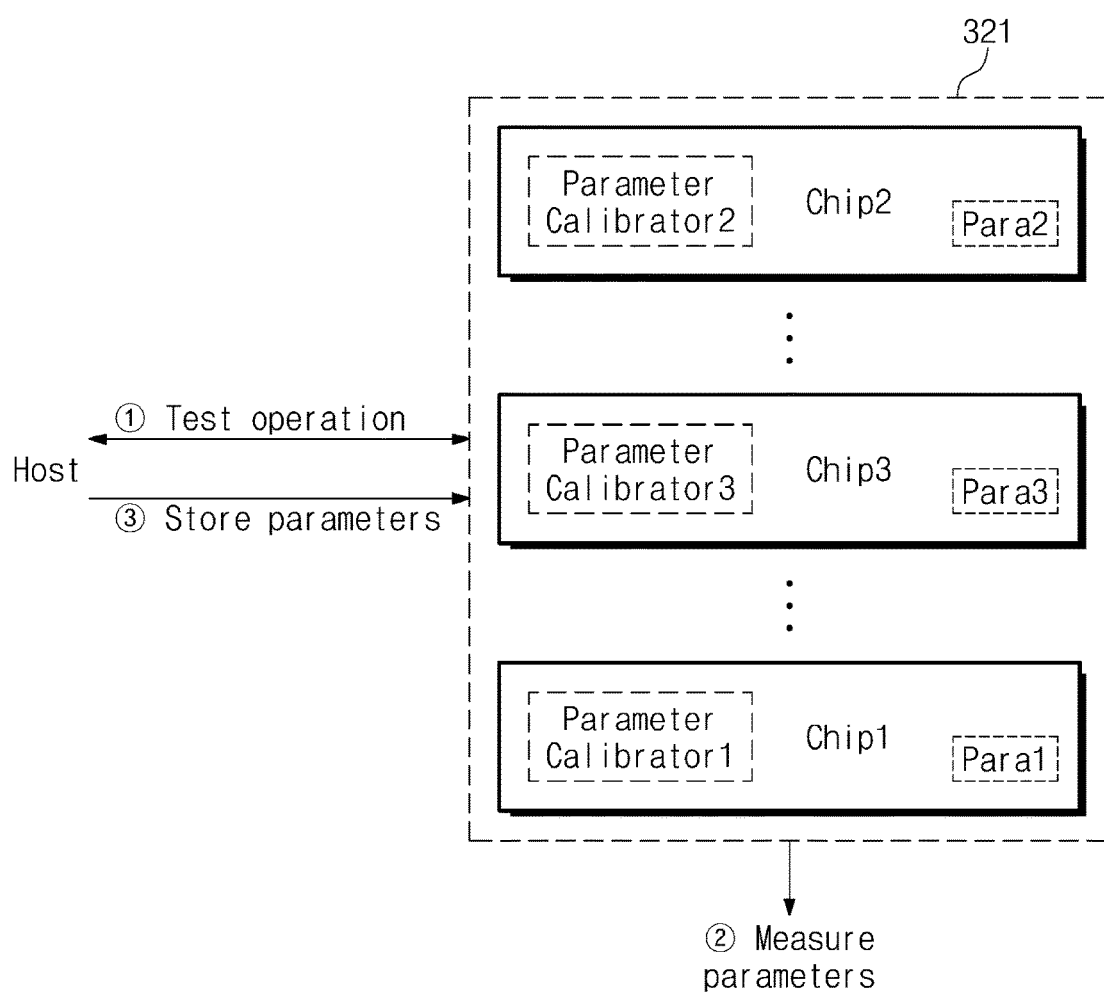
FIG. 18 is a block diagram illustrating one of semiconductor packages described in FIG. 16, according to certain embodiments.

FIG. 18 is a block diagram illustrating one of the semiconductor packages described in FIG. 17. In one embodiment, a first semiconductor package 321 is illustrated in FIG. 18 which includes only three chips, that is, the first chip chip1, the second chip chip2, and the third chip chip3. The first to third semiconductor chips chip1 to chip3 illustrated in FIG. 18 may correspond to the first to third semiconductor chips chip1 to chip3 illustrated in FIGS. 3 to 5, respectively.

Referring to FIG. 18, a test operation may be performed with respect to the first semiconductor package 321 that is manufactured through a packaging process (①). For example, a host may be test equipment such as automatic test equipment (ATE). The test operation may include the following operations with respect to each semiconductor chip of the first semiconductor package 321: a program operation, a verification operation, a read operation, an erase operation, a trimming operation (TRIM), and garbage collection.

Feature parameters para1 to para3, which are respectively associated with operations of the semiconductor chips chip1 to chip3, may be measured during the test operation (②). Each of the feature parameters para1 to para3 may include voltages needed to perform various operations including the program operation, verification operation, read operation, erase operation, trimming operation (TRIM), and garbage collection. Also, each feature parameter may further include an internal voltage needed to drive a logic circuit (or a peripheral circuit) included in each of the semiconductor chips chip1 to chip3. For example, the feature parameters para1 to para3 may be measured by separate measurement equipment (not illustrated) through probing.

The measured feature parameters para1 to para3 may be respectively stored in specific areas of the semiconductor chips (③).

Figure 19:
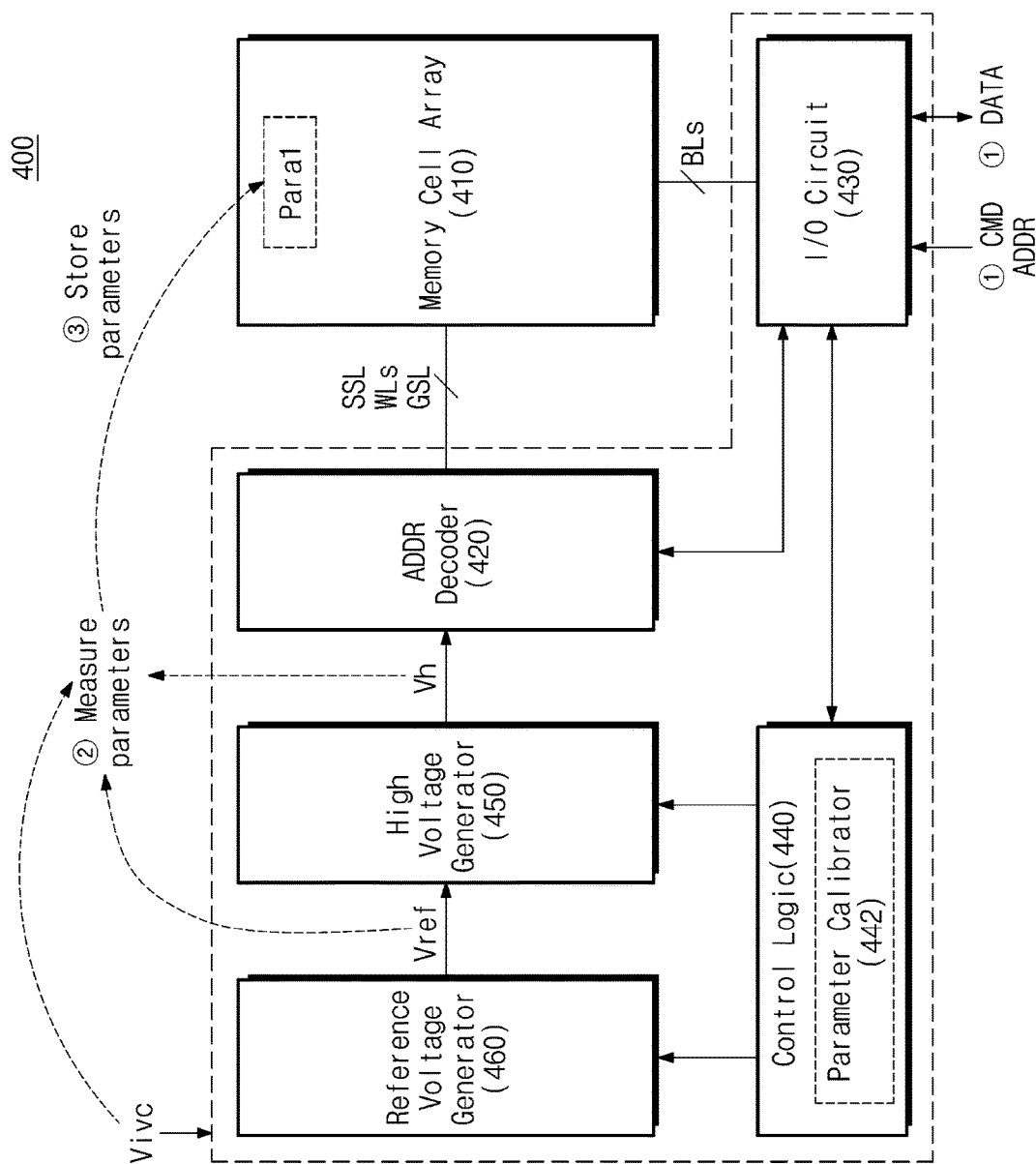
FIG. 19 is a detailed block diagram of one of semiconductor chips illustrated in FIG. 18, according to certain embodiments.

FIG. 19 is a detailed block diagram of one of the semiconductor chips chip1 to chip3 illustrated in FIG. 18. Referring to FIG. 19, a semiconductor chip 400 may include a memory cell array 410, an address decoder 420, an input/output circuit 430, control logic 440, a high voltage generator 450, and a reference voltage generator 460. The semiconductor chip 400 is similar to that described with reference to FIG. 8 except a parameter calibrator 442 is implemented in the semiconductor chip 400, and thus, a description thereof will not be repeated here. An embodiment is illustrated in FIG. 19 as the control logic 440 performs a function of the parameter calibrator 442. However, the parameter calibrator 442 may be implemented with a separate logic circuit in the semiconductor chip 400.

A command CMD and an address ADDR may be input to the input/output circuit 430 as a test operation between a host and the semiconductor chip 400 is performed (①). Write data "DATA" received from the host for the test operation may be input to the input/output circuit 430, or read data "DATA" read out from the memory cell array 410 may be output to the host (①).

A feature parameter may be measured during test operation (②). For example, the feature parameter may include a reference voltage Vref, a high voltage Vh, and an internal voltage Vivc. The high voltage Vh may include a program voltage, a verification voltage, a read voltage, an erase voltage, a pass voltage, etc. and may be generated by using the reference voltage Vref. Also, the internal voltage Vivc may be a voltage that is needed to drive a peripheral circuit including at least one of the address decoder 420, the input/output circuit 430, the control logic 440, the high voltage generator 450, and the reference voltage generator 460.

The measured feature parameter para1 may be stored in a specific area of the semiconductor chip 400 (③). For example, the feature parameter para1 may be stored in a specific area (e.g., an area in which firmware or metadata is stored) of the memory cell array 410 or may be stored in a separate space such as E-FUSE (not illustrated) or a register (not illustrated).

Figure 20:
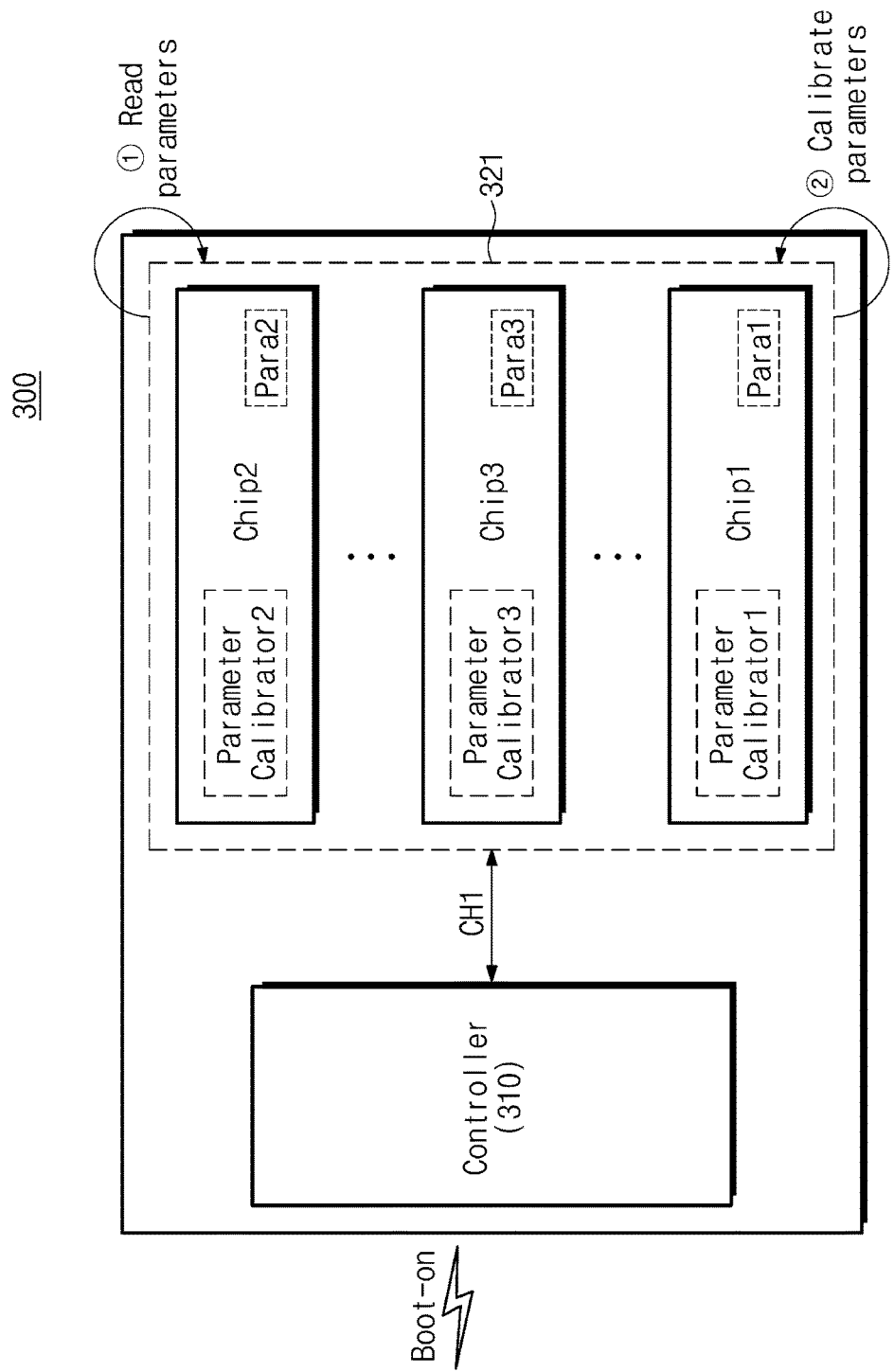
FIG. 20 is a block diagram illustrating how a data storage device is controlled, according to an embodiment of the inventive concept.
Figure 21:
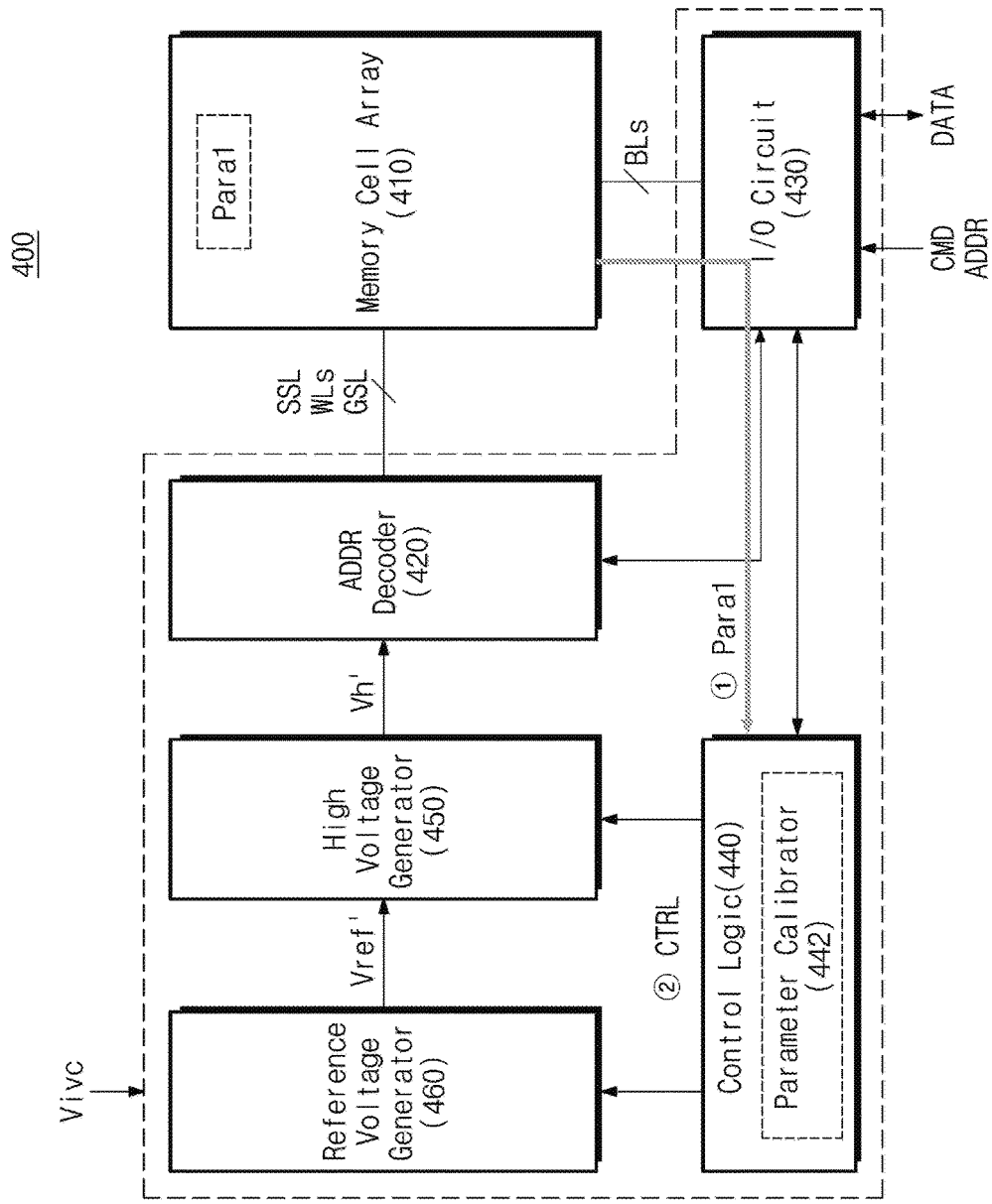
FIG. 21 is a block diagram for describing how a first semiconductor chip illustrated in FIG. 20 is controlled, according to certain embodiments.

FIG. 20 is a block diagram illustrating how the data storage device 300 is controlled, according to an embodiment of the inventive concept. The data storage device 300 may include the controller 310 and a plurality of semiconductor packages. However, for descriptive convenience, only the first semiconductor package 321 is illustrated in FIG. 20. Also, the first to third semiconductor chips chip1 to chip3 among a plurality of semiconductor chips constituting the first semiconductor package 321 are illustrated in FIG. 20. FIG. 21 is a block diagram for describing how the first semiconductor chip illustrated in FIG. 20 is controlled. A description will be given with reference to FIGS. 20 and 21.

When the data storage device 300 is booted on, feature parameters para1 to para3 respectively stored in the semiconductor chips chip1 to chip3 may be read out (①). Also, target values, which are respectively stored in specific spaces (e.g., E-FUSE, etc.) of the semiconductor chips chip1 to chip3, may be read together with the feature parameters. A target value may refer to a value associated with a physical characteristic of a semiconductor chip originally designed by the memory vendor. The read feature parameters para1 to para3 may have such a tendency as described with reference to FIGS. 4 and 5. For example, in the first semiconductor 400, a first feature parameter para1 read from the memory cell array 410 may be provided to the control logic 440 so as to be stored in a separate storage space such as a register. For example, a target value read from E-FUSE may be stored in a separate storage space such as a register.

The parameter calibrator 442 may generate a control signal CTRL for calibrating the feature parameter para1 (②). In response to the control signal CTRL, the high voltage generator 450 or the reference voltage generator 460 may generate the same feature parameter (e.g., Vref' or Vh') as a target value originally designed by the memory vendor. Since the above-described operation is performed in each semiconductor chip, feature parameters (e.g., Vref' or Vh'), which are respectively generated in the semiconductor chips, may have the same values.

Figure 22:
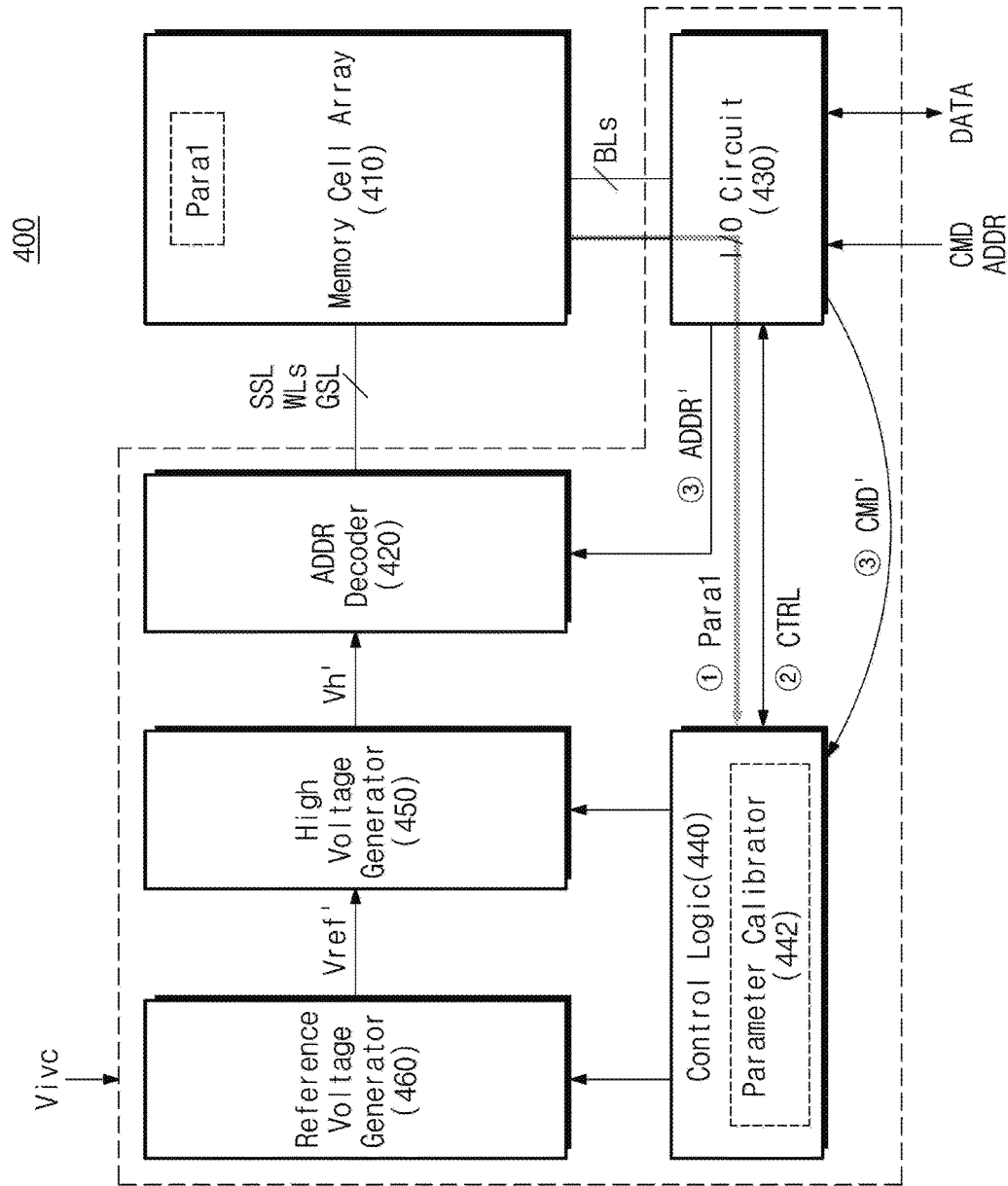
FIG. 22 is a block diagram for describing how a first semiconductor chip of FIG. 18 is controlled, according to certain embodiments.

FIG. 22 is a block diagram for describing how the first semiconductor chip chip1 illustrated in FIG. 18 is controlled. For example, a feature parameter to be described in FIG. 22 is a toggling frequency of a data strobe signal for each reference period described with reference to FIG. 12.

When a data storage device including the semiconductor chip 400 is booted on, the first feature parameter para1 read from the memory cell array 410 may be sent to the control logic 440. Also, a target value, which is stored in a specific space (e.g., E-FUSE, etc.) of each semiconductor chip, may be read together with the feature parameter para1. A target value may refer to a value associated with a physical characteristic of a semiconductor chip originally designed by the memory vendor. The first feature parameter para1 and a reference value may be stored in a separate space, which is implemented in the control logic 440 or in the semiconductor chip 400, such as a register (not illustrated).

A command CMD and an address ADDR may be input to the input/output circuit 430 when a write request or read request is issued from a host (not illustrated). However, toggling frequencies of the received command CMD and address ADDR for each reference period may be different from a value originally designed by the memory vendor.

In this case, the parameter calibrator 442 may generate the control signal CTRL for calibrating a toggling frequency for each reference period. The toggling frequencies of the received command CMD and address ADDR for each reference period may be the same as the value originally designed by the memory vendor, under control of the control signal CTRL. That is, a command CMD' and an address ADDR' of which the toggling frequencies are calibrated may be generated (③). If write data "DATA" is input to the input/output circuit 430, a toggling frequency of the write data "DATA" for each reference period may be calibrated in the same method as described above. If read data "DATA" is output from the input/output circuit 430, a toggling frequency of the read data "DATA" for each reference period may be calibrated in the same method as described above.

The above-described operation of calibrating a feature parameter may be performed with respect to each of semiconductor chips included in a data storage device. In this case, feature parameters originally designed by the memory vendor may be respectively generated in the semiconductor chips, thereby securing the reliability of the data storage device 400.

An embodiment is exemplified as during booting-on of the data storage device 400, a feature parameter is read and a semiconductor chip is controlled such that a value of the feature parameter is the same as a target value. However, timing when a semiconductor chip is controlled may be determined variously. For example, read feature parameters may be calibrated upon wake-up from a power saving mode or may be calibrated during an idle time when a host request does not exist. In addition, as described above, a feature parameter may be calibrated in consideration of various factors such as the number of P/E cycles, a temperature of a periphery, or occurrence of error bits at a read operation.

Figure 23:
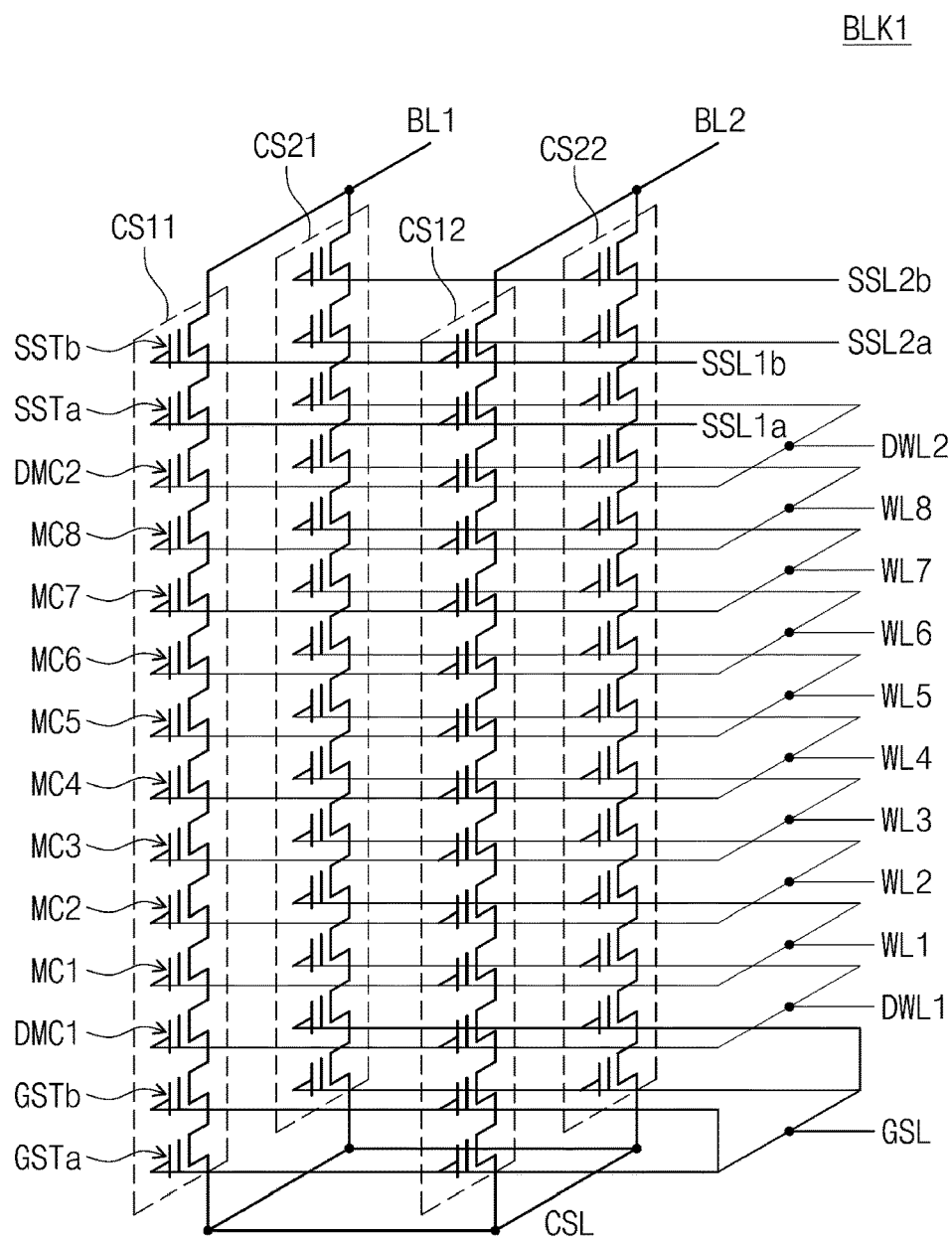
FIG. 23 is a circuit diagram illustrating one of memory blocks included in a memory cell array in FIG. 10, 12, 18, 20, or 21, according to certain embodiments.

FIG. 23 is a circuit diagram illustrating one of memory blocks included in the memory cell array in FIG. 10, 12, 18, 20, or 21, according to certain example embodiments. In one embodiment, a memory block BLK1 having a three-dimensional structure will be described with reference to FIG. 21.

Referring to FIG. 23, the memory block BLK1 may include a plurality of cell strings CS11, CS12, CS21, and CS22. The cell strings CS11, CS12, CS21, and CS22 may be arranged along a row direction and a column direction to form rows and columns.

For example, the cell strings CS11 and CS12 may be connected to string selection lines SSL1a and SSL1b to form a first row. The cell strings CS21 and CS22 may be connected to string selection lines SSL2a and SSL2b to constitute a second row.

For example, the cell strings CS11 and CS21 may be connected to a first bit line BL1 to constitute a first column. The cell strings CS12 and CS22 may be connected to a second bit line BL2 to constitute a second column.

Each of the cell strings CS11, CS12, CS21, and CS22 may include a plurality of cell transistors. Each of the cell strings CS11, CS12, CS21, and CS22 may include string selection transistors SSTa and SSTb, a plurality of memory cells MC1 to MC8, ground selection transistors GSTa and GSTb, and dummy memory cells DMC1 and DMC2. In one embodiment, each of the memory cells included in the cell strings CS11, CS12, CS21, and CS22 may be a charge trap flash (CTF) memory cell.

The memory cells MC1 to MC8 may be serially connected and may be stacked in a height direction being a direction perpendicular to a plane defined by a row direction and a column direction. In each cell string, the string selection transistors SSTa and SSTb may be serially connected and may be arranged between the memory cells MC1 to MC8 and a bit line BL1 or BL2. In each cell string, the ground selection transistors GSTa and GSTb may be serially connected and may be arranged between the memory cells MC1 to MC8 and a common source line CSL.

In one embodiment, in each cell string, a first dummy memory cell DMC1 may be arranged between the memory cells MC1 to MC8 and the ground selection transistors GSTa and GSTb. In one embodiment, in each cell string, a second dummy memory cell DMC2 may be arranged between the memory cells MC1 to MC8 and the string selection transistors SSTa and SSTb.

The ground selection transistors GSTa and GSTb of the cell strings CS11, CS12, CS21, and CS22 may be connected in common to a ground selection line GSL. Alternatively, ground selection transistors in the same row may be connected to the same ground selection line, and ground selection transistors in different rows may be connected to another ground selection line. For example, the first ground selection transistors GSTa of the cell strings CS11 and CS12 in the first row may be connected to a first ground selection line (not shown), and the first ground selection transistors GSTa of the cell strings CS21 and CS22 in the second row may be connected to a second ground selection line (not shown).

In one embodiment, even though not illustrated in FIG. 23, ground selection transistors arranged at the same height from a substrate (not illustrated) may be connected to the same ground selection line, and ground selection transistors provided at a different height may be connected to a different ground selection line. For example, in the cell strings CS11, CS12, CS21, and CS22, the first ground selection transistors GSTa may be connected to the first ground selection line, and the second ground selection transistors GSTb may be connected to the second ground selection line.

Memory cells arranged at the same height from the substrate (or the ground selection transistors GSTa and GSTb) may be connected in common to the same word line, and memory cells arranged at different heights therefrom may be connected to different word lines. For example, memory cells MC1 to MC8 of the cell strings CS11, CS12, CS21, and CS22 may be connected to first to eighth word lines WL1 to WL8.

String selection transistors, which belong to the same row, from among the first string selection transistors SSTa arranged at the same height may be connected to the same string selection line, and string selection transistors, which belong to different rows, from among the first string selection transistors SSTa may be connected to different string selection lines. For example, the first string selection transistors SSTa of the cell strings CS11 and CS12 in the first row may be connected in common to the string selection line SSL1a, and the first string selection transistors SSTa of the cell strings CS21 and CS22 in the second row may be connected in common to the string selection line SSL1a.

String selection transistors, which belong to the same row, from among the second string selection transistors SSTb arranged at the same height may be connected to the same string selection line, and string selection transistors, which belong to different rows, from among the second string selection transistors SSTb may be connected to different string selection lines. For example, the second string selection transistors SSTb of the cell strings CS11 and CS12 in the first row may be connected in common to the string selection line SSL1b, and the second string selection transistors SSTb of the cell strings CS21 and CS22 in the second row may be connected in common to the string selection line SSL2b.

Even though not illustrated in FIG. 23, string selection transistors of cell strings in the same row may be connected in common to the same string selection line. For example, the first and second string selection transistors SSTa and SSTb of the cell strings CS11 and CS12 in the first row may be connected in common to the same string selection line. The first and second string selection transistors SSTa and SSTb of the cell strings CS21 and CS22 in the second row may be connected in common to the same string selection line.

In one embodiment, dummy memory cells at the same height may be connected with the same dummy word line, and dummy memory cells at different heights may be connected with different dummy word lines. For example, the first dummy memory cells DMC1 may be connected to a first dummy word line DWL1, and the second dummy memory cells DMC2 may be connected to a second dummy word line DWL2.

In the memory block BLK1, read and write operations may be performed in units of rows. For example, a row of the first memory block BLK1 may be selected by the string selection lines SSL1a, SSL1b, SSL2a, and SSL2b.

For example, the cell strings CS11 and CS12 in the first row may be respectively connected to the bit lines BL1 and BL2 when a turn-on voltage is supplied to the string selection lines SSL1a and SSL1b and a turn-off voltage is supplied to the string selection lines SSL2a and SSL2b. The cell strings CS21 and CS22 in the second row may be respectively connected to the bit lines BL1 and BL2 when the turn-on voltage is supplied to the string selection lines SSL2a and SSL2b and the turn-off voltage is supplied to the string selection lines SSL1a and SSL1b. Memory cells, which are arranged at the same height, from among memory cells in cell strings connected to the driven word line may be selected by driving a word line. Read and write operations may be performed with respect to the selected memory cells. The selected memory cells may constitute a physical page unit.

In the memory block BLK1, memory cells may be erased in units of memory blocks or sub-blocks. When an erase operation is performed in units of memory blocks, all memory cells MC in the memory block BLK1 may be simultaneously erased according to an erase request. When the erase operation is performed in units of sub-blocks, some of memory cells MC in the memory block BLK1 may be simultaneously erased according to an erase request while the remaining memory cells therein are erase-inhibited. A low voltage (e.g., a ground voltage) may be supplied to a word line connected to erased memory cells MC, and a word line connected to erase-inhibited memory cells MC may be floated.

In one embodiment, the memory block BLK1 illustrated in FIG. 23 is, but is not limited thereto, only exemplary. For example, the number of cell strings may increase or decrease, and the number of rows of cell strings and the number of columns of cell strings may increase or decrease according to the number of cell strings. In the memory block BLK1, the number of cell transistors (GST, MC, DMC, SST, etc.) may increase or decrease, and a height of the memory block BLK1 may increase or decrease according to the number of cell transistors (GST, MC, DMC, SST, etc.). Furthermore, the number of lines (GSL, WL, DWL, SSL, etc.) connected with cell transistors may increase or decrease according to the number of cell transistors.

Figure 24:
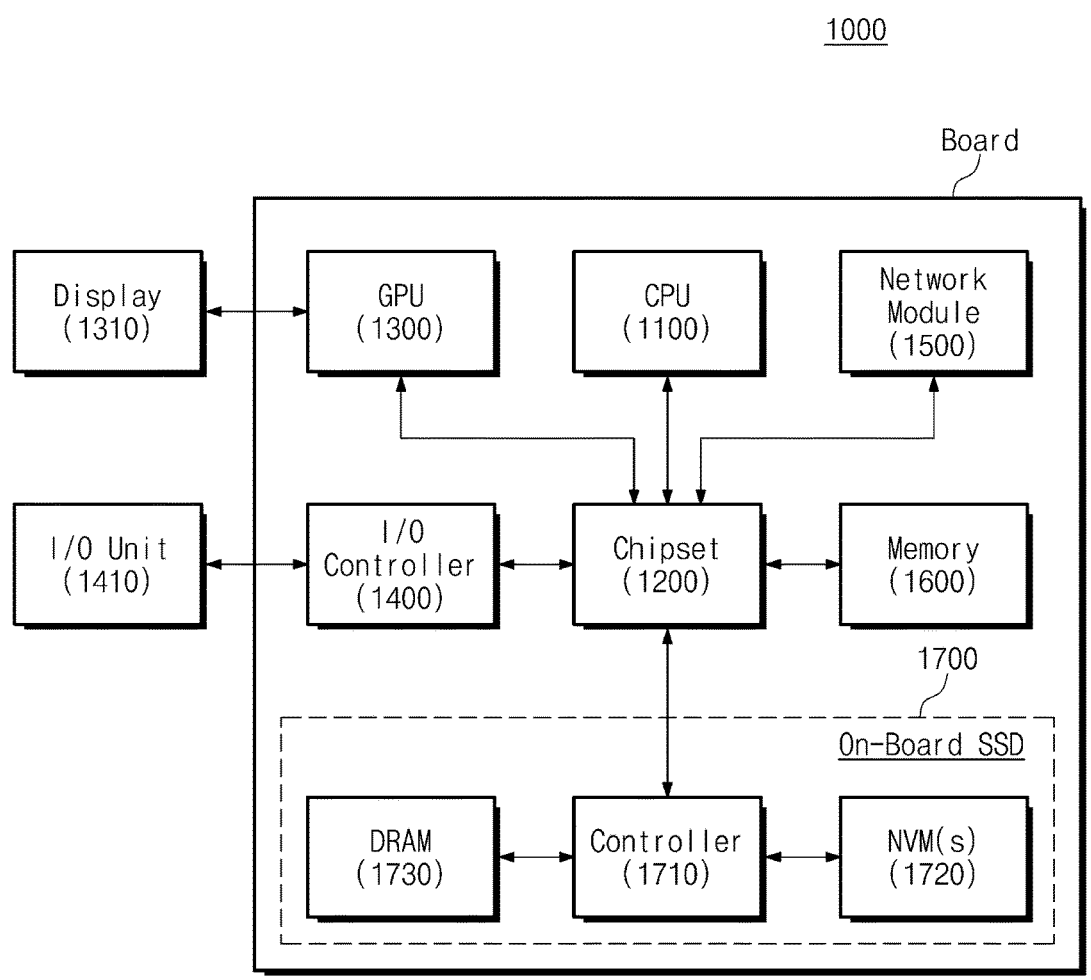
FIG. 24 is a block diagram of a computing system to which a data storage device according to an embodiment of the inventive concept is applied.

FIG. 24 is a block diagram of a computing system to which the data storage device according to an embodiment of the inventive concept is applied. For example, a computing system 1000 may include at least one of various electronic devices such as a desktop, a laptop, an ultra-mobile PC (UMPC), a net-book, a tablet, and a smartphone.

Referring to FIG. 24, the computing system 1000 may include a central processing unit (CPU) 1100, a chipset 1200, a graphics processing unit (GPU) 1300, a display 1310, an input/output (I/O) controller 1400, an I/O unit 1410, a network module 1500, a memory 1600, an on-board SSD 1700. The on-board SSD 1700 may be a data storage device in which a controller 1710, a nonvolatile memory 1720, a DRAM 1730, etc. constituting the data storage device are directly mounted on a board.

The CPU 1100, the chipset 1200, the GPU 1300, the I/O controller 1400, the network module 1500, the memory 1600, the controller 1710, and the nonvolatile memory 1720 may be provided on a board. For example, the board may include at least one of various types of boards such as a printed circuit board (PCB), a flexible board, and a tape board. The board may be a flexible printed circuit board, a rigid printed circuit board, or a combination thereof in which internal wires are formed therein.

The CPU 1100 may drive an operating system (OS) or an application program for operating the computing system 1000.

The chipset 1200 may control various components, which are included in the computing system 1000, under control of the CPU 1100. For example, the chipset 1200 may control operations of the GPU 1300, the I/O controller 1400, the network module 1500, the memory 1600, and the on-board SSD 1700 overall.

The GPU 1300 may process graphic data and may provide the processed graphic data to a display 1310. The display 1310 may display the graphic data processed by the GPU 1300. A panel of the display 1310 may be a liquid crystal display (LCD) panel, an electrophoretic display panel, an electrowetting display panel, a plasma display panel (PDP), an organic light-emitting diodes (OLED), etc.

The I/O controller 1400 may process information input to the computing system 1000 by an I/O unit 1410. For example, the I/O unit 1410 may be connected with the I/O controller 1400 through a personal system 2 (PS2) port, a peripheral component interconnection (PCI) slot, a dual in-line memory module (DIMM) slot, an universal serial bus (USB) port, a red, green, blue (RGB) port, a digital video interactive (DVI) port, a high definition multimedia interface (HDMI) port, etc.

The network module 1500 may provide an interface between the computing system 1000 and an external system or a network. For example, the network module 1500 may operate based on a protocol such as a wireless-fidelity (Wi-Fi), a Bluetooth, a wireless metropolitan area network (MAN), a long term evolution advanced (LTE-A), an enhanced data rates for global system for mobile communications (GSM) evolution, a evolved high-speed packet access (HSPA+), an Ethernet, a fibre channel, or a power line communication.

The memory 1600 may be used as a working memory of the computing system 1000. At booting, an OS, an application, etc. read from the on-board SSD 1700 may be loaded on the RAM 1600. For example, the memory 1600 may be implemented with a memory module. In this case, the memory module may include a volatile random access memory, such as a DRAM, an SDRAM, a double date rate DRAM (DDR SDRAM), a DDR2 SDRAM, a DDR3 SDRAM, an LPDDR DRAM, an LPDDR2 DRAM, or an LPDDR3 DRAM or a nonvolatile random access memory, such as a PRAM, an MRAM, a RRAM, or FRAM.

The on-board SSD 1700 may include the controller 1710, the nonvolatile memories 1720, and the DRAM 1730. The nonvolatile memories 1720 may be composed of a plurality of semiconductor packages. Each of the semiconductor packages may include a multi stack chip composed of a plurality of semiconductor chips. The controller 1710 may include a parameter calibrator described in this specification. The controller 1710 and the nonvolatile memories 1720 may be delivered from a memory vendor to an assembling line. Afterwards, the controller 1710, the nonvolatile memory 1720, and the DRAM 1730, which are components of the on-board SSD 1700, may be mounted on a board by an SMT process.

According to an embodiment of the inventive concept, reliability of a data storage device including a multi-stack chip package may be improved.

While various aspects of the inventive concept have been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A multi-stack chip package comprising:
a first semiconductor chip arranged on a package substrate and having a first measured feature parameter value for a particular feature parameter;
a second semiconductor chip arranged on the first semiconductor chip and having a second measured feature parameter value for the particular feature parameter; and
a third semiconductor chip arranged between the first and second semiconductor chips and having a third measured feature parameter value for the particular feature parameter,
wherein the first to third semiconductor chips are controlled based on a difference (hereinafter referred to as a "first feature difference") between the first measured feature parameter value and a target value, a difference (hereinafter referred to as a "second feature difference") between the second measured feature parameter value and the target value, and a difference (hereinafter referred to as a "third feature difference") between the third measured feature parameter value and the target value, and
wherein the first feature difference is greater than the third feature difference and the second feature difference is greater than the third feature difference,
wherein the particular feature parameter comprises at least one of:
a high voltage comprising at least one of a program voltage, a verification voltage, a read voltage, an erase voltage, and a pass voltage of a corresponding one of the first to third semiconductor chip;
a reference voltage used for generating the high voltage;
an internal voltage for operating the corresponding semiconductor chip;
a temperature compensation offset;
an incremental step pulse programming (ISPP) voltage; and
a toggling frequency for each reference period, which is associated with a data strobe signal input to the corresponding semiconductor chip.

2. A multi-stack chip package comprising:
a first semiconductor chip arranged on a package substrate and having a first measured feature parameter value for a particular feature parameter;
a second semiconductor chip arranged on the first semiconductor chip and having a second measured feature parameter value for the particular feature parameter; and
a third semiconductor chip arranged between the first and second semiconductor chips and having a third measured feature parameter value for the particular feature parameter,
wherein the first to third semiconductor chips are controlled based on a difference (hereinafter referred to as a "first feature difference") between the first measured feature parameter value and a target value, a difference (hereinafter referred to as a "second feature difference") between the second measured feature parameter value and the target value, and a difference (hereinafter referred to as a "third feature difference") between the third measured feature parameter value and the target value, and wherein the first feature difference is greater than the third feature difference and the second feature difference is greater than the third feature difference, wherein the first to third feature differences vary depending on a location of circuits associated with the particular feature parameter.

3. A data storage method in a multi-stack chip package comprising a first semiconductor chip, a second semiconductor chip, and a third semiconductor chip, wherein the first semiconductor chip is arranged on a package substrate and has a first measured feature parameter value for a first particular feature parameter, the second semiconductor chip is arranged on the first semiconductor chip and has a second measured feature parameter value for the first particular feature parameter, and the third semiconductor chip is arranged between the first and second semiconductor chips and has a third measured feature parameter value for the first particular feature parameter, the method comprising:

controlling the first semiconductor chip by using the first measured feature parameter value and a target value, controlling the second semiconductor chip using the second measured feature parameter value and the target value, and controlling the third semiconductor chip using the third measured feature parameter value and the target value, wherein a difference between the first measured feature parameter value and the target value ("first feature difference") is greater than a difference between the third measured feature parameter value and the target value ("third feature difference"), and a difference between the second measured feature parameter value and the target value ("second feature difference") is greater than the third feature difference.

4. The data storage method of claim 3, further comprising:

storing the first measured feature parameter value in the first semiconductor chip, and using the stored first measured feature parameter value and the target value to control an adjustment of the first particular feature parameter for the first semiconductor chip;

storing the second measured feature parameter value in the second semiconductor chip, and using the stored second measured feature parameter value and the target value to control an adjustment of the first particular feature parameter for the second semiconductor chip; and storing the third measured feature parameter value in the third semiconductor chip, and using the stored third measured feature parameter value and the target value to control an adjustment of the first particular feature parameter for the third semiconductor chip.

5. The data storage method of claim 4, wherein:

the first particular feature parameter on one of the first semiconductor chip, the second semiconductor chip, and the third semiconductor chip is adjusted a different amount from that of at least one of the other two semiconductor chips.

* * * * *